US011894355B2

(12) United States Patent
Jeon et al.

(10) Patent No.: US 11,894,355 B2
(45) Date of Patent: Feb. 6, 2024

(54) DISPLAY DEVICE AND METHOD OF FABRICATING THE SAME

(71) Applicant: Samsung Display Co., LTD., Yongin-si (KR)

(72) Inventors: Kyung Jin Jeon, Incheon (KR); So Young Koo, Hwaseong-si (KR); Eok Su Kim, Seoul (KR); Hyung Jun Kim, Seoul (KR); Yun Yong Nam, Hwaseong-si (KR); Jun Hyung Lim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 204 days.

(21) Appl. No.: 17/471,581

(22) Filed: Sep. 10, 2021

(65) Prior Publication Data

US 2022/0115364 A1    Apr. 14, 2022

(30) Foreign Application Priority Data

Oct. 12, 2020    (KR) .................. 10-2020-0131049

(51) Int. Cl.
*H01L 25/16*    (2023.01)
*H01L 27/12*    (2006.01)

(52) U.S. Cl.
CPC .......... *H01L 25/167* (2013.01); *H01L 27/124* (2013.01); *H01L 27/1259* (2013.01)

(58) Field of Classification Search
CPC .................. H01L 27/1214; H01L 2933/0066
See application file for complete search history.

(56) References Cited

U.S. PATENT DOCUMENTS

| 2017/0358563 | A1* | 12/2017 | Cho .................. H01L 33/38 |
| 2019/0214373 | A1 | 7/2019 | Kim et al. |
| 2022/0013693 | A1 | 1/2022 | Cho et al. |

FOREIGN PATENT DOCUMENTS

| EP | 3 913 672 | | 11/2021 |
| KR | 2007094410 A | * | 9/2007 |
| KR | 10-1947007 | | 2/2019 |
| KR | 10-2019-0070384 | | 6/2019 |

(Continued)

OTHER PUBLICATIONS

Partial European search report for European Patent Application or Patent No. 21202016.8 dated Mar. 14, 2022.

*Primary Examiner* — Alexander P Gross
(74) *Attorney, Agent, or Firm* — KILE PARK REED & HOUTTEMAN PLLC

(57) ABSTRACT

A display device includes a first conductive layer disposed on a substrate, a passivation layer disposed on the first conductive layer, a second conductive layer disposed on the passivation layer, a via layer disposed on the second conductive layer, a third conductive layer disposed on the via layer, the third conductive layer including a first electrode, a second electrode, a connection pattern, the first electrode, the second electrode, and the connection pattern being spaced apart from each other, and a light emitting element, a first end and a second end of the light emitting element being disposed on the first electrode and the second electrode, respectively, wherein the connection pattern electrically connects the first conductive layer and the second conductive layer through a first contact hole penetrating the via layer and the passivation layer.

15 Claims, 21 Drawing Sheets

(56) References Cited

FOREIGN PATENT DOCUMENTS

| KR | 10-2020-0068150 | 6/2020 |
|----|-----------------|--------|
| WO | 2020/091171 | 5/2020 |
| WO | 2020/149517 | 7/2020 |

* cited by examiner

DISPLAY DEVICE AND METHOD OF FABRICATING THE SAME

CROSS-REFERENCE TO RELATED APPLICATION(S)

This application claims priority to and the benefit of Korean Patent Application No. 10-2020-0131049 under 35 U.S.C. § 119, filed on Oct. 12, 2020, in the Korean Intellectual Property Office (KIPO), the entire contents of which are incorporated herein by reference.

BACKGROUND

1. Technical Field

The disclosure relates to a display device and a method of fabricating the same.

2. Description of Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

SUMMARY

Aspects of the disclosure provide a display device fabricated by a method of fabricating a display device with improved process efficiency.

Aspects of the disclosure also provide a method of fabricating a display device with improved process efficiency.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, there is provided a display device including a first conductive layer disposed on a substrate; a passivation layer disposed on the first conductive layer; a second conductive layer disposed on the passivation layer; a via layer disposed on the second conductive layer; a third conductive layer disposed on the via layer, the third conductive layer including a first electrode, a second electrode, and a connection pattern, the first electrode, the second electrode, and the connection pattern being spaced apart from each other; and a light emitting element, a first end and a second end of the light emitting element being disposed on the first electrode and the second electrode, respectively, wherein the connection pattern electrically connects the first conductive layer and the second conductive layer through a first contact hole penetrating the via layer and the passivation layer.

In an embodiment, the first contact hole may expose at least a part of an upper surface of the second conductive layer, at least a part of a side surface of the second conductive layer, and at least a part of an upper surface of the first conductive layer.

In an embodiment, the connection pattern may electrically contact the part of the upper surface of the first conductive layer, the part of the upper surface of the second conductive layer, and the side surface of the second conductive layer.

In an embodiment, the first contact hole may comprise a first part formed by sidewalls of the via layer, a second part formed by a side surface of the second conductive layer and a sidewall of the via layer and a third part formed by sidewalls of the passivation layer, and the first part, the second part, and the third part of the first contact hole overlap each other in a thickness direction of the substrate.

In an embodiment, a width of the first part may be greater than a width of the second part, and the width of the first part may be greater than a width of the third part.

In an embodiment, the first part, the second part, and the third part may be integral with each other and form a hole.

In an embodiment, the third part may overlap the first conductive layer in the thickness direction of the substrate and may not overlap the second conductive layer in the thickness direction of the substrate.

In an embodiment, the third part may not be disposed between the first conductive layer and the second conductive layer in the thickness direction of the substrate.

In an embodiment, the display device may further include a first insulating layer disposed on the third conductive layer. The first insulating layer may completely overlap the connection pattern, and the light emitting element may be disposed on the first insulating layer.

In an embodiment, the display device may further comprise a first contact electrode disposed on the first insulating layer and electrically contacting the first end of the light emitting element and the first electrode; and a second contact electrode disposed on the first insulating layer and electrically contacting the second end of the light emitting element and the second electrode.

In an embodiment, the display device may further include a transistor disposed between the substrate and the second conductive layer. The transistor may comprise an active layer, a gate electrode, a first source/drain electrode, and a second source/drain electrode. The first source/drain electrode and the second source/drain electrode may be included in the first conductive layer.

In an embodiment, the second conductive layer may further comprise a first power line, and the connection pattern may electrically connect the first power line and the first source/drain electrode of the transistor through the first contact hole.

In an embodiment, the first electrode may be electrically connected to the second source/drain electrode of the transistor through a second contact hole penetrating the via layer and the passivation layer.

In an embodiment, the connection pattern may electrically contact at least a part of an upper surface of the first source/drain electrode of the transistor, at least a part of an upper surface of the first power line, and a side surface of the first power line.

In an embodiment, the passivation layer may be disposed between the first conductive layer and the second conductive layer in the thickness direction of the substrate.

According to another aspect of the disclosure, there is provided a method of fabricating a display device. The method may include forming a first conductive layer on a surface of a substrate; depositing a passivation layer on the first conductive layer to overlap the first conductive layer;

forming a second conductive layer on the passivation layer to overlap at least a part of the first conductive layer in a thickness direction of the substrate; depositing a via layer on the second conductive layer to overlap the second conductive layer; forming a first bank layer on the via layer to include an opening which overlaps at least a part of an upper surface of the first conductive layer, at least a part of an upper surface of the second conductive layer, and at least a part of a side surface of the second conductive layer in the thickness direction of the substrate; and etching the first bank layer, the via layer, and the passivation layer by using the first bank layer as an etch mask.

In an embodiment, the etching of the first bank layer may be performed by whole surface etching.

In an embodiment, the forming of the first bank layer on the via layer may include forming the first bank layer to include a first area having a first height and a second area having a greater height than the first area, etching the first area by the whole surface etching to form a first bank, and etching the via layer and the passivation layer overlapping the opening to form a first contact hole penetrating the first bank, the via layer, and the passivation layer.

In an embodiment, the method may further include forming a third conductive layer to include a first electrode, a second electrode and a connection pattern disposed on the first bank and spaced apart from each other.

In an embodiment, the method may further include depositing the connection pattern into the first contact hole to electrically contact at least a part of the upper surface of the first conductive layer, and at least a part of an upper surface of the second conductive layer, and at least a part of a side surface of the second conductive layer.

In a display device according to an embodiment, a first conductive layer, a passivation layer disposed on a surface of the first conductive layer, a second conductive layer disposed on the passivation layer, a via layer disposed on the second conductive layer, and a third conductive layer disposed on the via layer are used as a connection electrode that connects the first conductive layer and the second conductive layer. Therefore, in a process of forming the passivation layer interposed between the first conductive layer and the second conductive layer, a separate mask process may be omitted. Accordingly, since an additional mask process for connecting the first conductive layer and the second conductive layer is not required, the process efficiency of the display device can be improved.

However, the effects of the disclosure are not restricted to the one set forth herein. The above and other effects of the disclosure will become more apparent to one of daily skill in the art to which the disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The same reference numbers indicate the same components throughout the specification. In the attached figures, the thickness of layers and regions may be exaggerated for clarity.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1:
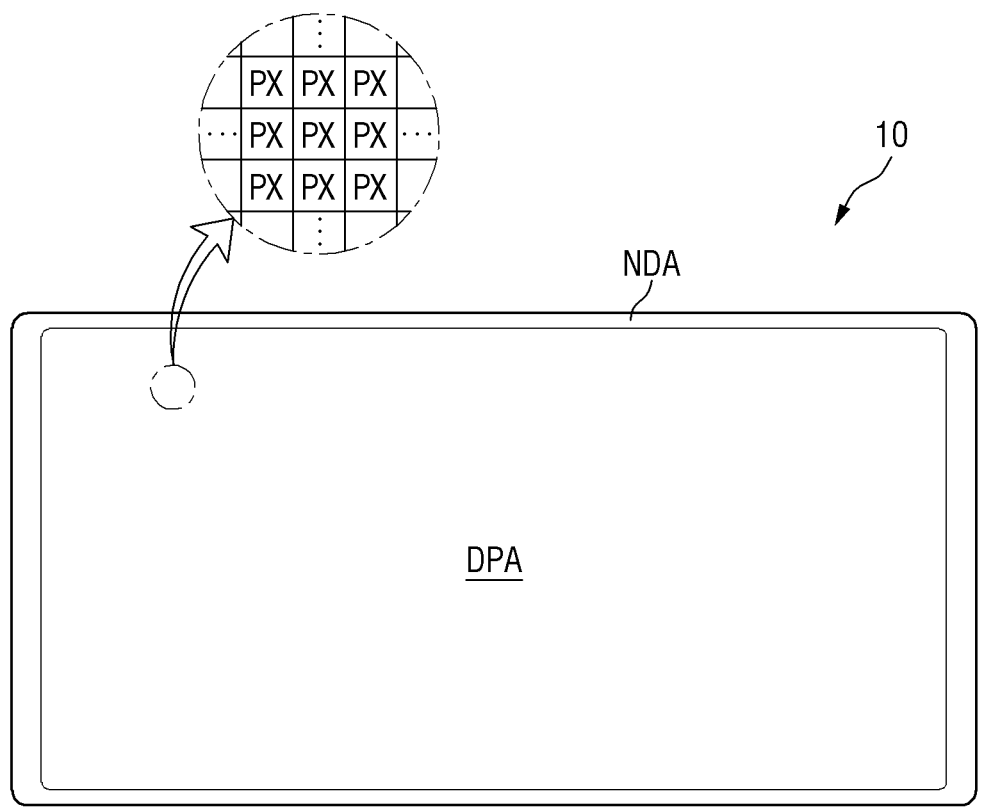
FIG. 1 is a schematic plan view of a display device according to an embodiment.

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, laptop personal computers (PCs), monitors, billboards, Internet of things (IoT) devices, mobile phones, smartphones, tablet PCs, electronic watches, smartwatches, watch phones, head-mounted displays (HMDs), mobile communication terminals, electronic notebooks, electronic books, portable multimedia players (PMPs), navigation devices, game consoles, digital cameras, and camcorders, all of which provide a display screen.

The display device 10 may include a display panel that provides a display screen. Examples of the display panel may include inorganic light emitting diode (LED) display panels, organic light emitting display panels, quantum dot light emitting display panels, plasma display panels, and field emission display panels. A case where an inorganic LED display panel is applied as an example of the display panel will be described below, but the disclosure is not limited to this case, and other display panels can also be applied as long as the same technical spirit is applicable thereto.

In the drawings of embodiments for explaining the display device 10, a first direction DR1, a second direction DR2, and a third direction DR3 may be defined. The first direction DR1 and the second direction DR2 may be directions perpendicular to each other in a plane. The third direction DR3 may be a direction perpendicular to the plane in which the first direction DR1 and the second direction DR2 are located. The third direction DR3 may be perpendicular to each of the first direction DR1 and the second direction DR2. In the embodiments for explaining the display device 10, the third direction DR3 may indicate a thickness direction (or a display direction) of the display device 10.

The display device 10 may have a rectangular shape including long sides and short sides and longer in the first direction DR1 than in the second direction DR2, in a plan view. Corners at which the long and short sides of the display device 10 meet each other may be right-angled in a plan view. However, the disclosure is not limited thereto, and the corners may also be rounded. The shape of the display device 10 is not limited to the above example and may also be variously changed. For example, the display device 10 may also have other shapes such as a square, a quadrangle with rounded corners (vertices), other polygons, and a circle, in a plan view.

A display surface of the display device 10 may be disposed on a side of the third direction DR3 which is the thickness direction. In the embodiments for explaining the display device 10, unless otherwise mentioned, the term "above" may mean in an upward direction or the third direction DR3 and may indicate the display direction, and an "upper surface" may indicate a surface disposed on an element in the third direction DR3. The term "below" may mean in a downward direction or in a direction opposite to the third direction DR3 and may indicate a direction opposite to the display direction, and "lower surface" may indicate a surface under an element in the direction opposite to the third direction DR3. The terms "left," "right," "upper," and "lower" may indicate directions in case that the display device 10 is viewed in a plan view. For example, "right" may indicate a side in the first direction DR1, "left" may indicate the other side in the first direction DR1, "upper" may indicate a side in the second direction DR2, and "lower" may indicate another side in the second direction DR2.

The display device 10 may include a display area DPA and a non-display area NDA. The display area DPA may be an area where an image can be displayed, and the non-display area NDA may be an area where no image is displayed.

The shape of the display area DPA may follow that of the display device 10. For example, the display area DPA may have a rectangular shape similar to the overall shape of the display device 10, in a plan view. The display area DPA may generally occupy the center of the display device 10.

The display area DPA may include pixels PX. The pixels PX may be arranged in a matrix direction. Each of the pixels PX may be rectangular or square in a plan view. In an embodiment, each of the pixels PX may include light emitting elements made of inorganic particles.

The non-display area NDA may be disposed around or adjacent the display area DPA. The non-display area NDA may entirely or partially surround the display area DPA. The non-display area NDA may form a bezel of the display device 10.

Figure 2:
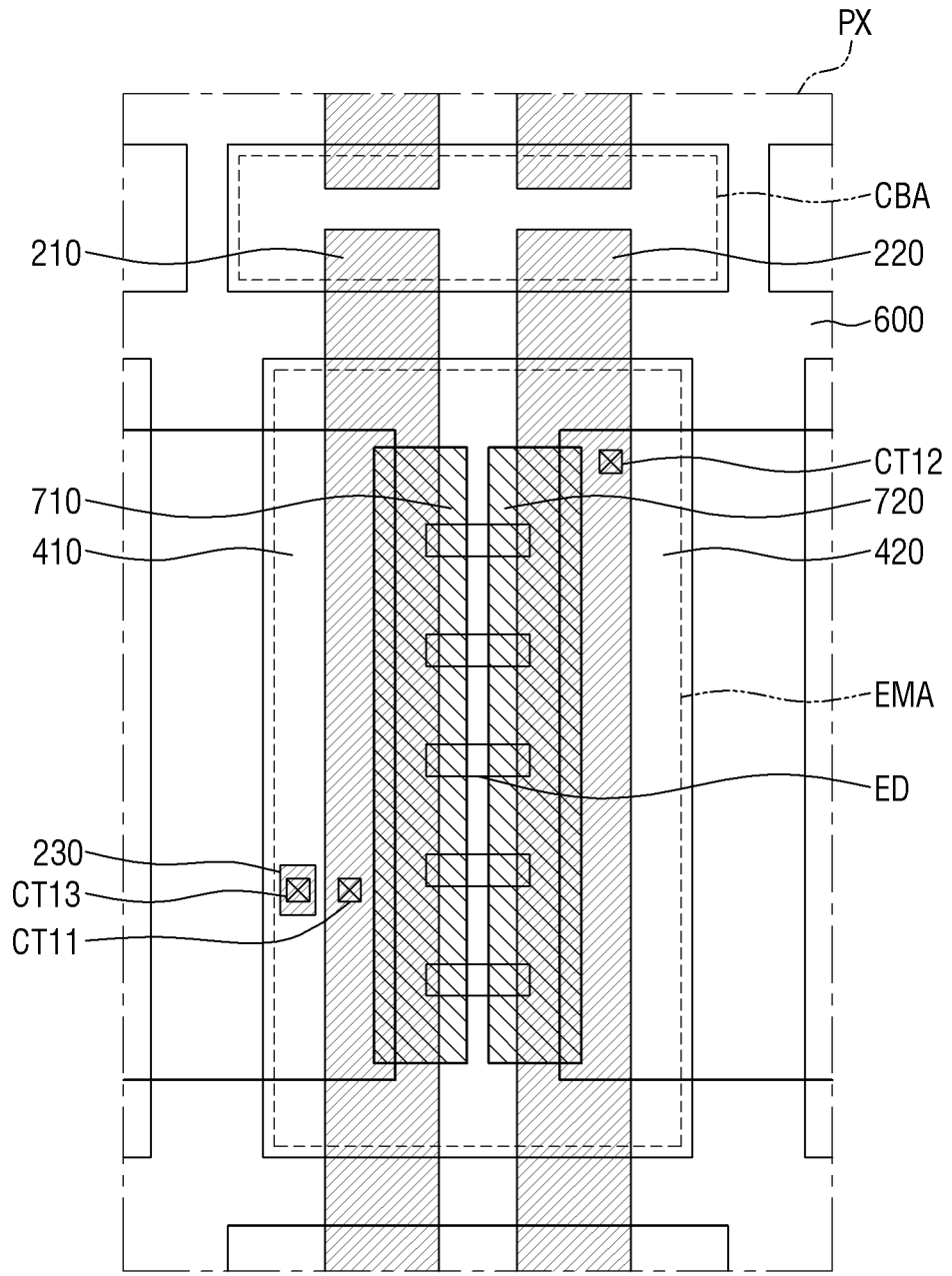
FIG. 2 is a schematic plan view of a pixel of the display device according to the embodiment.

FIG. 2 is a schematic plan view of a pixel PX of the display device 10 according to the embodiment.

Referring to FIG. 2, each pixel PX of the display device 10 may include an emission area EMA and a non-emission area. The emission area EMA may be an area from which light emitted from light emitting elements ED is output, and the non-emission area may be an area from which no light is output because light emitted from the light emitting elements ED does not reach this area.

The emission area EMA may include an area in which the light emitting elements ED are disposed and an area which is adjacent to the above area. The emission area EMA may further include an area from which light emitted from the light emitting elements ED is output after being reflected or refracted by other members.

Each pixel PX may further include a first area CBA disposed in the non-emission area. The first area CBA may be disposed on an upper side (or a side in the second direction DR2) of the emission area EMA in a pixel PX. The first area CBA may be disposed between the emission areas EMA of pixels PX neighboring each other in the second direction DR2.

The first area CBA may be an area where first electrodes 210 and second electrodes 220 included in pixels PX neighboring each other in the second direction DR2 are separated from each other. The first and second electrodes 210 and 220 disposed in each pixel PX may be separated in the first area CBA from the first and second electrodes 210 and 220 disposed in a neighboring pixel PX, and parts of the first and second electrodes 210 and 220 disposed in each pixel PX may be disposed in the first area CBA. The light emitting elements ED may not be disposed in the first area CBA.

Figure 3:
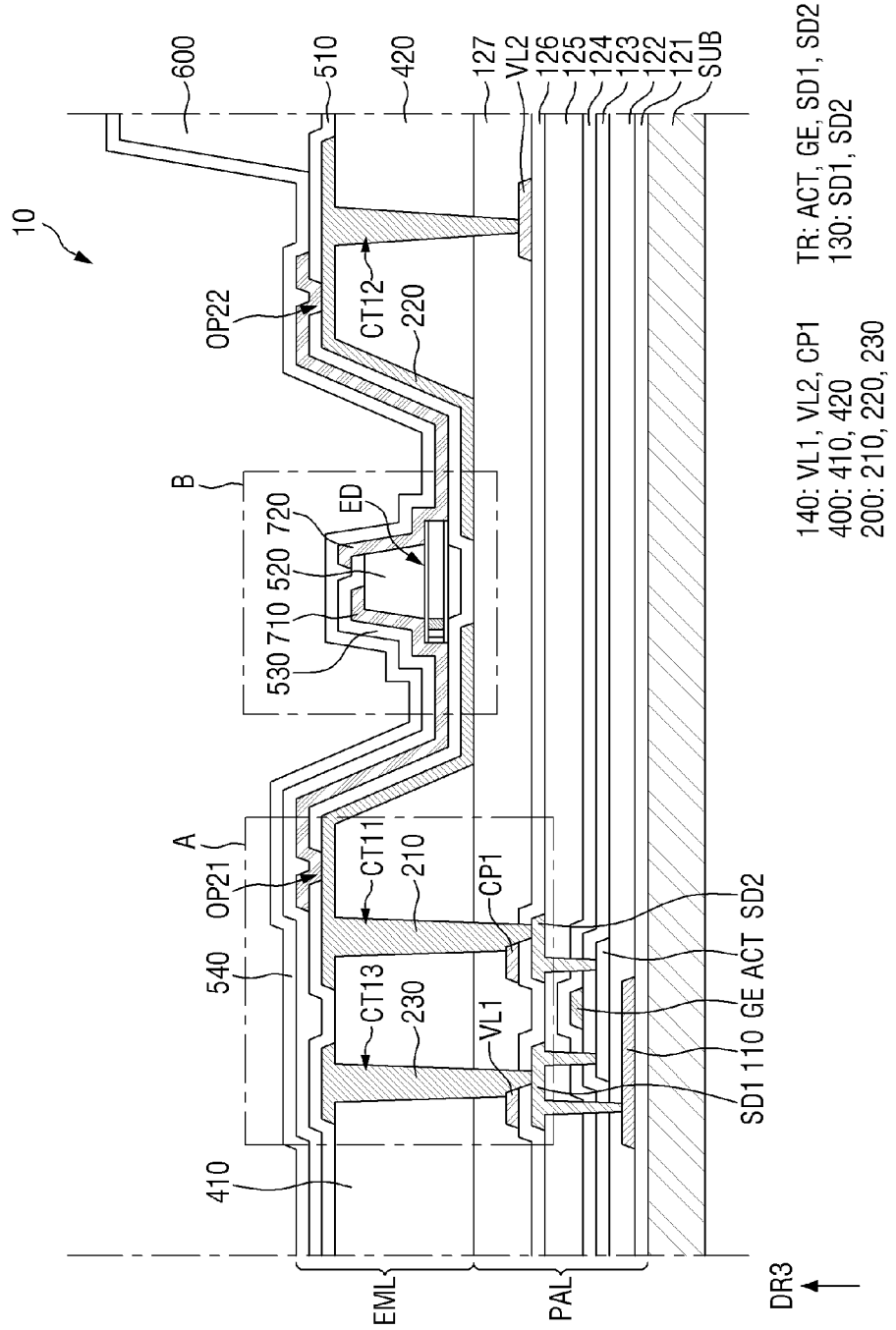
FIG. 3 is a schematic cross-sectional view of the display device according to the embodiment.

FIG. 3 is a schematic cross-sectional view of the display device 10 according to the embodiment.

Referring to FIGS. 2 and 3, the display device 10 may include a substrate SUB, a circuit element layer PAL disposed on the substrate SUB, and a light emitting element layer EML disposed on the circuit element layer PAL.

The circuit element layer PAL may be disposed on a surface of the substrate SUB. In the circuit element layer PAL, transistors of each pixel PX, scan lines, data lines, power lines, scan control lines, and routing lines connecting pads and the data lines may be formed. Each of the transistors may include a gate electrode, a semiconductor layer, a source electrode, and a drain electrode.

The circuit element layer PAL may include a barrier layer 121, a buffer layer 122, a semiconductor layer, conductive layers, insulating layers, and a via layer 127 disposed on the substrate SUB.

The light emitting element layer EML may be disposed on the circuit element layer PAL. The light emitting element layer EML may include light emitting elements ED to emit light to the outside of the display device 10 by the driving of the transistors of the circuit element layer PAL.

The light emitting element layer EML may include a third conductive layer 200, the light emitting elements ED, a first contact electrode 710, a second contact electrode 720, insulating layers, a first bank 400, and a second bank 600 disposed on the via layer 127 of the circuit element layer PAL. The circuit element layer PAL may include at least one transistor to drive the light emitting element layer EML.

Layers of the circuit element layer PAL disposed in a pixel PX of the display device 10 will now be described with reference to FIG. 3.

The substrate SUB may be an insulating substrate. The substrate SUB may be made of an insulating material such as glass, quartz, or polymer resin. The substrate SUB may be a rigid substrate but may also be a flexible substrate that can be bent, folded, rolled, etc.

The barrier layer 121 may be disposed on the substrate SUB. The barrier layer 121 may prevent oxygen and moisture from entering a transistor TR.

A bottom metal layer 110 may be disposed on the substrate SUB. The bottom metal layer 110 may be a light blocking layer that protects an active layer ACT of the transistor TR from external light. The bottom metal layer 110 may include a material that blocks light. For example, the bottom metal layer 110 may be made of an opaque metal material that blocks transmission of light.

The bottom metal layer 110 may have a patterned shape. The bottom metal layer 110 may be disposed under the active layer ACT of the transistor TR to cover or overlap at least a channel region of the active layer ACT of the transistor TR and, by extension, to cover or overlap the whole of the active layer ACT of the transistor TR. However, the disclosure is not limited thereto, and the bottom metal layer 110 may be omitted.

The buffer layer 122 may be disposed on the bottom metal layer 110. The buffer layer 122 may protect the transistor TR from moisture introduced through the substrate SUB which is vulnerable to moisture penetration. The buffer layer 122 may include inorganic layers stacked alternately.

The transistor TR may be disposed on the buffer layer 122 and may form a pixel circuit of each pixel PX. For example, the transistor TR may be a driving transistor or a switching transistor of the pixel circuit. Although FIG. 3 illustrates only a transistor TR among the transistors included in each pixel PX of the display device 10, the disclosure is not limited thereto. Each pixel PX of the display device 10 may also include a larger number of transistors. For example, the display device 10 may include two or three transistors in each pixel PX.

The semiconductor layer may be disposed on the buffer layer 122. The semiconductor layer may include the active layer ACT of the transistor TR. The active layer ACT may overlap the bottom metal layer 110.

The semiconductor layer may include polycrystalline silicon, monocrystalline silicon, an oxide semiconductor, or the like. In an embodiment, in case that the semiconductor layer includes polycrystalline silicon, the polycrystalline silicon may be formed by crystallizing amorphous silicon. In case that the semiconductor layer includes polycrystalline silicon, the active layer ACT may include doping regions doped with impurities and the channel region between the doping regions. In an embodiment, the semiconductor layer may include an oxide semiconductor. The oxide semiconductor may include, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulating film 123 may be disposed on the semiconductor layer. The gate insulating film 123 may function as a gate insulating film of the transistor TR. The gate insulating film 123 may be an inorganic layer including an inorganic material such as silicon oxide ($SiO_x$), silicon nitride ($SiN_x$) or silicon oxynitride (SiON) or may have a structure in which the above materials are stacked.

A gate conductive layer may be disposed on the gate insulating film 123. The gate conductive layer may include a gate electrode GE of the transistor TR. The gate electrode GE may overlap the channel region of the active layer ACT in the third direction DR3.

The gate conductive layer may be formed as, but is not limited to, a single layer or a multi-layer made of one or more of molybdenum (Mo), aluminum (Al), chromium (Cr), gold (Au), titanium (Ti), nickel (Ni), neodymium (Nd), copper (Cu), and an alloy thereof.

A first interlayer insulating film 124 may be disposed on the gate conductive layer. The first interlayer insulating film 124 may cover or overlap the gate electrode GE. The first interlayer insulating film 124 may include an inorganic insulating material such as silicon oxide ($SiO_x$), silicon nitride ($SiN_x$), or silicon oxynitride (SiON).

A second interlayer insulating film 125 may be disposed on the first interlayer insulating film 124. The second interlayer insulating film 125 may planarize steps (or height differences) formed by the first interlayer insulating film 124. The second interlayer insulating film 125 may include an organic insulating material. However, the disclosure is not limited thereto, and the second interlayer insulating film 125 may be omitted.

A first conductive layer 130 may be disposed on the second interlayer insulating film 125. The first conductive layer 130 may include a first source/drain electrode SD1 and a second source/drain electrode SD2 of the transistor TR. Although not illustrated in the drawings, the first conductive layer 130 may further include a data line.

The first and second source/drain electrodes SD1 and SD2 of the transistor TR may respectively be electrically connected to both end regions of the active layer ACT of the transistor TR (e.g., the doping regions of the active layer ACT of the transistor TR) through contact holes penetrating the second interlayer insulating film 125, the first interlayer insulating film 124, and the gate insulating film 123. The first source/drain electrode SD1 of the transistor TR may be electrically connected to the bottom metal layer 110 through another contact hole penetrating the second interlayer insulating film 125, the first interlayer insulating film 124, the gate insulating film 123, and the buffer layer 122.

The first conductive layer 130 may be, but is not limited to, a single layer or multi-layer made of (or including) one or more of molybdenum (Mo), aluminum (Al), chromium (Cr), gold (Au), titanium (Ti), nickel (Ni), neodymium (Nd), copper (Cu), and an alloy thereof.

A passivation layer 126 may be disposed on the first conductive layer 130. The passivation layer 126 may be provided on the transistor TR to cover or overlap and protect the transistor TR. The passivation layer 126 may include an inorganic insulating material such as silicon oxide ($SiO_x$), silicon nitride ($SiN_x$), or silicon oxynitride (SiON).

A second conductive layer 140 may be disposed on the passivation layer 126. The second conductive layer 140 may include a first power line VL1, a second power line VL2, and a first conductive pattern CP1.

A high potential voltage (or a first power supply voltage) may be supplied to the first power line VL1, and a low potential voltage (or a second power supply voltage) lower than the high potential voltage (the first power supply voltage) supplied to the first power line VL1 may be supplied to the second power line VL2.

The second power line VL2 may be electrically connected to the second electrode 220 to supply the low potential voltage (the second power supply voltage) to the second electrode 220. An alignment signal required to align the light emitting elements ED may be transmitted to the second power line VL2 during a process of fabricating the display device 10.

The first power line VL1 may overlap the first source/drain electrode SD1 of the transistor TR in the third direction DR3. The first power line VL1 may be electrically connected to the first source/drain electrode SD1 of the transistor TR through a connection pattern 230 to be described later.

The first conductive pattern CP1 may overlap the second source/drain electrode SD2 of the transistor TR in the third direction DR3. The first conductive pattern CP1 may be electrically connected to the second source/drain electrode SD2 of the transistor TR through the first electrode 210.

The second conductive layer 140 may be, but is not limited to, a single layer or a multi-layer made of (or including) one or more of molybdenum (Mo), aluminum (Al), chromium (Cr), gold (Au), titanium (Ti), nickel (Ni), neodymium (Nd), copper (Cu), and an alloy thereof.

The via layer 127 may be disposed on the second conductive layer 140. The via layer 127 may be disposed on the passivation layer 126 on which the second conductive layer 140 is disposed. The via layer 127 may planarize the surface. The via layer 127 may include an organic insulating material, for example, an organic material such as polyimide (PI).

The structure of the light emitting element layer EML disposed on the via layer 127 of the circuit element layer PAL will now be described in detail with reference to FIGS. 2 and 3.

The first bank 400 may be disposed on the via layer 127. The first bank 400 may include a first subbank 410 and a second subbank 420 spaced apart from each other in the first direction DR1.

The first and second subbanks 410 and 420 may extend in the second direction DR2, but upper and lower ends of the first and second subbanks 410 and 420 may end within a pixel PX so as not to extend to other pixels PX neighboring in the second direction DR2. However, the disclosure is not limited thereto, and the first and second subbanks 410 and 420 may also extend to other pixels PX neighboring in the second direction DR2.

The first and second subbanks 410 and 420 may be disposed over the emission area EMA and the non-emission area. The first and second subbanks 410 and 420 may be disposed over other pixels PX neighboring in the first direction DR1. For example, the first and second subbanks 410 and 420 may be disposed not only in the emission area EMA of each pixel PX neighboring in the first direction DR1 but also at boundaries of the neighboring pixels PX.

At least a part of each of the first and second subbanks 410 and 420 may protrude from an upper surface of the via layer 127 in a cross-sectional view. Each of the first and second subbanks 410 and 420 may include inclined side surfaces. For example, the first and second subbanks 410 and 420 including the inclined side surfaces may change the direction of light emitted from the light emitting elements ED and travelling toward the side surfaces of the first and second subbanks 410 and 420 to an upward direction (e.g., the display direction). For example, the first and second subbanks 410 and 420 may provide a space in which the light emitting elements ED are disposed while functioning as a reflective barrier that changes the direction of light emitted from the light emitting elements ED to the display direction.

Although FIG. 3 illustrates that each side surface of each of the first and second subbanks 410 and 420 is inclined in a linear shape, the disclosure is not limited thereto. For example, each side surface of each of the first and second subbanks 410 and 420 may have a semicircular or semi-elliptical shape.

The third conductive layer 200 may be disposed on the first bank 400. The third conductive layer 200 may include the first electrode 210, the second electrode 220, and the connection pattern 230 spaced apart from each other.

The first electrode 210 may be disposed on the first subbank 410. The first electrode 210 may extend in the second direction DR2 in a plan view to overlap a part of the second bank 600 which extends in the first direction DR1. The first electrode 210 may be electrically connected to the circuit element layer PAL through a second contact hole CT11. The first electrode 210 may be electrically connected to a part of the first conductive layer 130 and a part of the second conductive layer 140 through the second contact hole CT11. Specifically, the first electrode 210 may be electrically connected to the second source/drain electrode SD2 of the transistor TR of the first conductive layer 130 and the first conductive pattern CP1 of the second conductive layer 140 through the second contact hole CT11.

The first electrode 210 may cover or overlap an upper surface and an inclined side surface of the first subbank 410. The first electrode 210 may be disposed on the first subbank 410 to cover or overlap the first subbank 410 in the third direction DR3 (or the thickness direction of the substrate SUB).

The second electrode 220 may be disposed on the second subbank 420. The second electrode 220 may be spaced apart from the first electrode 210. The second electrode 220 may extend in the second direction DR2 in a plan view to overlap or overlap a part of the second bank 600 which extends in the first direction DR1. The second electrode 220 may be electrically connected to the circuit element layer PAL through a third contact hole CT12. The second electrode 220 may be electrically connected to a part of the second conductive layer 140 through the third contact hole CT12. Specifically, the second electrode 220 may be electrically connected to the second power line VL2 of the second conductive layer 140 through the third contact hole CT12.

The second electrode 220 may cover or overlap an upper surface and an inclined side surface of the second subbank 420. The second electrode 220 may be disposed on the second subbank 420 to cover or overlap the second subbank 420 in the third direction DR3 (or the thickness direction of the substrate SUB).

The first electrode 210 and the second electrode 220 respectively disposed on the first subbank 410 and the second subbank 420 may extend outward to lie in at least part of a space formed between the first subbank 410 and the second subbank 420 spaced apart from each other. The first electrode 210 and the second electrode 220 may be spaced apart from each other to face each other in the space formed between the first subbank 410 and the second subbank 420 spaced apart from each other.

Each of the first and second electrodes 210 and 220 may be electrically connected to the light emitting elements ED and may receive a predetermined voltage so that the light emitting elements ED can emit light. For example, the electrodes 210 and 220 may be electrically connected to the light emitting elements ED disposed between the first subbank 410 and the second subbank 420 through the first and second contact electrodes 710 and 720 to be described below and may transmit received electrical signals to the light emitting elements ED through the contact electrodes 710 and 720.

The connection pattern 230 may be disposed on the first subbank 410. The connection pattern 230 disposed on the first subbank 410 may be spaced apart from the first electrode 210. The connection pattern 230 may electrically connect the first and second conductive layers 130 and 140 of the circuit element layer PAL through a first contact hole CT13. The connection pattern 230 may electrically connect the first source/drain electrode SD1 of the transistor TR of the first conductive layer 130 and the first power line VL1 of the second conductive layer 140 through the first contact hole CT13. This will be described in detail below.

The third conductive layer 200 may include a conductive material having high reflectivity. For example, the third conductive layer 200 may include a metal such as silver (Ag), copper (Cu) or aluminum (Al) as a material having high reflectivity or may be an alloy including aluminum (Al), nickel (Ni), or lanthanum (La). The third conductive layer 200 including a conductive material having high reflectivity may reflect, in the display direction (e.g., the third direction DR3), light emitted from the light emitting elements ED and travelling to the first electrode 210 and the second electrode 220 disposed on side surfaces of the first bank 400.

However, the disclosure is not limited thereto, and the third conductive layer 200 may further include a transparent conductive material. For example, the third conductive layer 200 may include a material such as ITO, IZO, or ITZO. In some embodiments, the third conductive layer 200 may have a structure in which a transparent conductive material and a metal layer having high reflectivity are each stacked in one or more layers or may be formed as a single layer including them. For example, the third conductive layer 200 may have a stacked structure of ITO/Ag/ITO, ITO/Ag/IZO, or ITO/Ag/ITZO/IZO.

A first insulating layer 510 may be disposed on the third conductive layer 200. The first insulating layer 510 may protect the first electrode 210, the second electrode 220, and the connection pattern 230 of the third conductive layer 200 while insulating them from each other. Specifically, the third conductive layer 200 may be disposed on the first electrode 210 and the second electrode 220 as well as an area between the first electrode 210 and the second electrode 220 to insulate them from each other. The first insulating layer 510 may completely cover or overlap an upper part of the connection pattern 230 to insulate the connection pattern 230 from the first and second electrodes 210 and 220. The first insulating layer 510 may also prevent the light emitting elements ED, disposed on the first insulating layer 510, from directly contacting other members and thus being damaged.

In an embodiment, fourth and fifth openings OP21 and OP22 may be formed in the first insulating layer 510 to expose a part of an upper surface of the first electrode 210 disposed on the first subbank 410 and a part of an upper surface of the second electrode 220 disposed on the second subbank 420. The first contact electrode 710 to be described below may electrically contact the first electrode 210 through the fourth opening OP21 penetrating the first insulating layer 510, and the second contact electrode 720 may electrically contact the second electrode 220 through the fifth opening OP22 penetrating the first insulating layer 510.

The second bank 600 may be disposed on the first insulating layer 510. The second bank 600 may be disposed on an upper surface of the first bank 400 on which the first insulating layer 510 is disposed. The second bank 600 may include parts extending in the first direction DR1 and the second direction DR2 to form a lattice pattern in a plan view. The second bank 600 may prevent ink including the light emitting elements ED from overflowing into adjacent pixels PX in an inkjet printing process for aligning the light emitting elements ED during the fabrication process of the display device 10.

The light emitting elements ED may be disposed on the first insulating layer 510 between the first subbank 410 and the second subbank 420. The light emitting elements ED may be disposed on the first insulating layer 510 such that ends of each light emitting element ED in the extending direction of the light emitting element ED lie on the first electrode 210 and the second electrode 220, respectively. The direction in which the light emitting elements ED extend may be substantially perpendicular to the direction in which each of the electrodes 210 and 220 extends. However, the disclosure is not limited thereto, and some of the light emitting elements ED may extend in the direction substantially perpendicular to the direction in which the first and second electrodes 210 and 220 extend, and some other ones of the light emitting elements ED may extend in a direction oblique to the direction in which the first and second electrodes 210 and 220 extend.

A second insulating layer 520 may be disposed on a part of each light emitting element ED. The second insulating layer 520 may partially cover or overlap an outer surface of each light emitting element ED but may not cover ends of the light emitting element ED.

A part of the second insulating layer 520 which is disposed on the light emitting elements ED may extend in the second direction DR2 on the first insulating layer 510 in a plan view to form a linear or island pattern in each pixel PX. The second insulating layer 520 may protect the light emitting elements ED while fixing the light emitting elements ED during the fabrication process of the display device 10.

The first contact electrode 710 may be disposed on the first electrode 210. The first contact electrode 710 may extend in a direction. The first contact electrode 710 may extend in the second direction DR2. The first contact electrode 710 may form a stripe pattern in the emission area EMA of each pixel PX.

The first contact electrode 710 may electrically contact the first electrode 210 and first ends of the light emitting elements ED. The first contact electrode 710 may be disposed on the first electrode 210 such that a part of the first contact electrode 710 electrically contacts a surface of the first electrode 210 exposed by the fourth opening OP21 formed in the first insulating layer 510, and another part of the first contact electrode 710 electrically contacts the first ends of the light emitting elements ED. The first contact electrode 710 electrically contacting the first ends of the light emitting elements ED and the first electrode 210 may electrically connect the light emitting elements ED and the first electrode 210. The first contact electrode 710 may extend from the first ends of the light emitting elements ED toward the second insulating layer 520 to lie on a part of the second insulating layer 520.

The second contact electrode 720 may be disposed on the second electrode 220. The second contact electrode 720 may extend in a direction. The second contact electrode 720 may extend in the second direction DR2. The second contact electrode 720 may form a stripe pattern in the emission area EMA of each pixel PX. The second contact electrode 720 may be spaced apart from the first contact electrode 710 to face the first contact electrode 710 in the first direction DR1.

The second contact electrode 720 may electrically contact the second electrode 220 and second ends of the light emitting elements ED. The second contact electrode 720 may be disposed on the second electrode 220 such that a part of the second contact electrode 720 electrically contacts a surface of the second electrode 220 exposed by the fifth opening OP22 formed in the first insulating layer 510, and another part of the second contact electrode 720 electrically contacts the second ends of the light emitting elements ED. The second contact electrode 720 electrically contacting the second ends of the light emitting elements ED and the second electrode 220 may electrically connect the light emitting elements ED and the second electrode 220. The second contact electrode 720 may extend from the second ends of the light emitting elements ED toward a third insulating layer 530, which will be described below, to lie on a part of the third insulating layer 530.

Each of the first and second contact electrodes 710 and 720 may include a conductive material such as ITO, IZO, ITZO, or aluminum (Al). For example, each of the first and second contact electrodes 710 and 720 may include, but is not limited to, a transparent conductive material.

The third insulating layer 530 may be disposed on the first contact electrode 710. The third insulating layer 530 may overlap the first contact electrode 710. End surfaces of the third insulating layer 530 and the second insulating layer 520 which face the second subbank 420 may be aligned with each other.

The third insulating layer 530 may electrically insulate the first contact electrode 710 and the second contact electrode 720 from each other. The third insulating layer 530 may overlap the first contact electrode 710 but may not be disposed on the second ends of the light emitting elements ED so that the light emitting elements ED can contact the second contact electrode 720.

The first contact electrode 710 and the second contact electrode 720 may be disposed on different layers. A part of the first contact electrode 710 may be directly disposed on the second insulating layer 520 disposed on the light emitting elements ED, and a part of the second contact electrode 720 may be directly disposed on the third insulating layer 530. Therefore, the third insulating layer 530 may be interposed between the first contact electrode 710 and the second contact electrode 720.

A fourth insulating layer 540 may be disposed on the entire surface of the substrate SUB. The fourth insulating layer 540 may protect the members disposed on the substrate SUB from the external environment.

Figure 4:
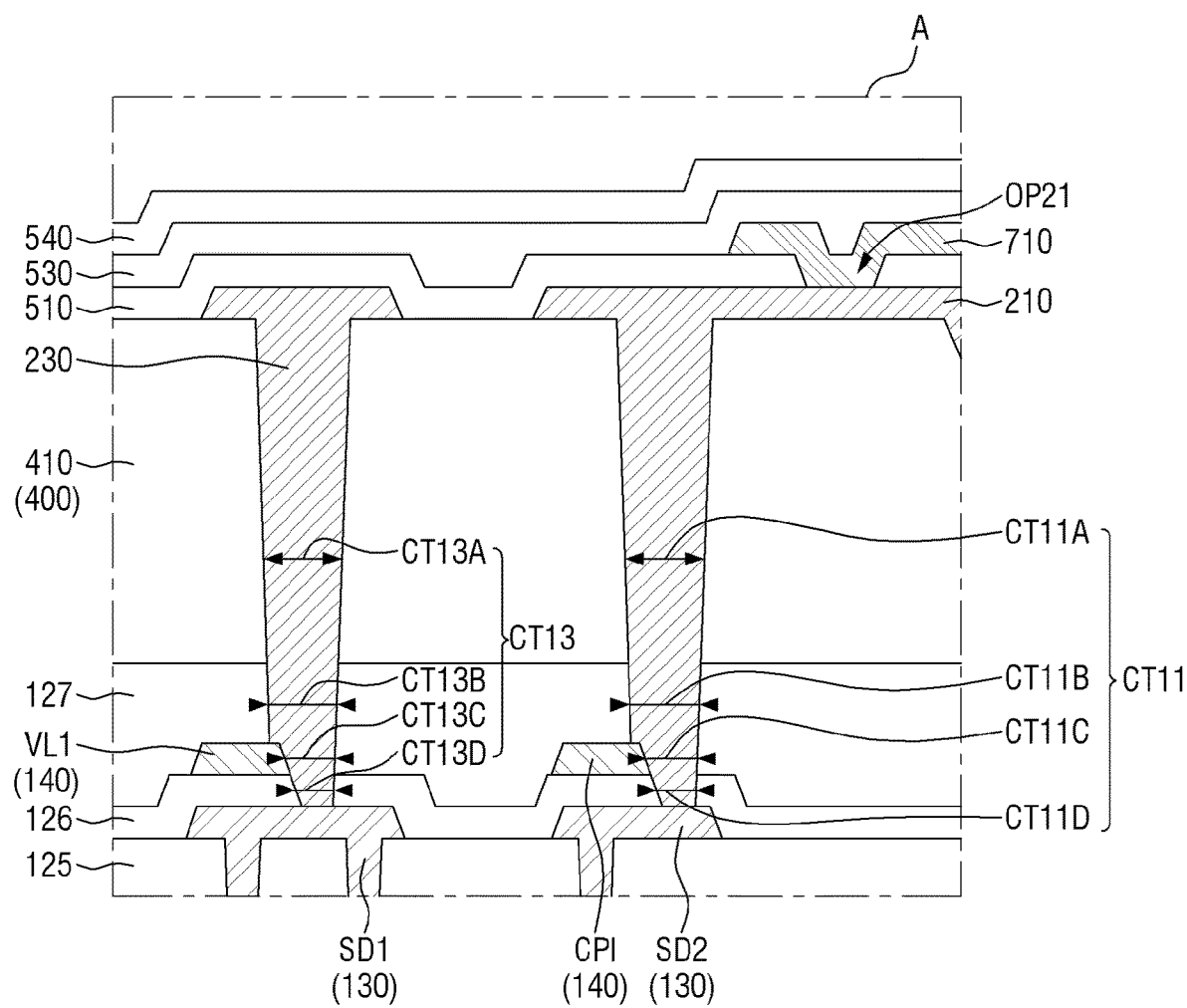
FIG. 4 is a schematic enlarged cross-sectional view of an example of area A of FIG. 3.

FIG. 4 is a schematic enlarged cross-sectional view of an example of area A of FIG. 3.

Referring to FIG. 4, the passivation layer 126 may be disposed on the first conductive layer 130, the second conductive layer 140 may be disposed on the passivation layer 126, and the via layer 127 and the first bank 400 may be disposed on the second conductive layer 140. The third conductive layer 200 may be disposed on the first bank 400. Although FIG. 4 illustrates that the third conductive layer 200 is disposed on a surface of the first bank 400, the disclosure is not limited thereto. For example, the third conductive layer 200 may be disposed on a surface of the via layer 127 exposed by the first bank 400.

The relationship between the first to third conductive layers 130, 140, and 200, the passivation layer 126, the via layer 127, and the first bank 400 will now be described in detail with reference to FIG. 4.

At least a part of the third conductive layer 200 may electrically connect the first conductive layer 130 and the second conductive layer 140 through the first and second contact holes CT13 and CT11 penetrating the first bank 400, the via layer 127, and the passivation layer 126.

Each of the first and second contact holes CT13 and CT11 may expose a part of an upper surface of the first conductive layer 130 and a side surface and a part of an upper surface of the second conductive layer 140 in the third direction DR3, and a part of the third conductive layer 200 may electrically contact the part of the upper surface of the first conductive layer 130 and the side surface and the part of the upper surface of the second conductive layer 140, thereby electrically connecting the first conductive layer 130 and the second conductive layer 140 to each other.

The passivation layer 126 may be interposed between the first conductive layer 130 and the second conductive layer 140 in the third direction DR3. For example, a separate contact hole penetrating the passivation layer 126 may not be formed between the first conductive layer 130 and the second conductive layer 140, and the first conductive layer 130 and the second conductive layer 140 may be electrically connected through a contact hole penetrating a side of the second conductive layer 140.

Specifically, the connection pattern 230 included in the third conductive layer 200 may electrically connect the first conductive layer 130 and the second conductive layer 140 through the first contact hole CT13 penetrating the first bank 400, the via layer 127, and the passivation layer 126. The connection pattern 230 may be disposed on the first subbank 410 to electrically connect the first power line VL1, included in the second conductive layer 140 and the first source/drain electrode SD1 of the transistor TR included in the first conductive layer 130 through the first contact hole CT13 penetrating the first subbank 410, the via layer 127 and the passivation layer 126.

The first contact hole CT13 may expose at least a part of an upper surface of the first source/drain electrode SD1 of the first conductive layer 130 and a side surface and a part of an upper surface of the first power line VL1 of the second conductive layer 140. The connection pattern 230 may electrically contact the side surface of the first power line VL1, the part of the upper surface of the first power line VL1, and the part of the upper surface of the first source/drain electrode SD1 exposed through the first contact hole CT13 in the third direction DR3.

The first contact hole CT13 may include a first part CT13A formed by sidewalls of the first subbank 410, a second part CT13B formed by sidewalls of the via layer 127, a third part CT13C formed by a side surface of the first power line VL1 and a sidewall of the via layer 127, and a fourth part CT13D formed by sidewalls of the passivation layer 126. The first to fourth parts CT13A to CT13D of the first contact hole CT13 may be integral with each other to form a hole.

A width of the first part CT13A of the first contact hole CT13 may be greater than those of the second to fourth parts CT13B to CT13D of the first contact hole CT13. The width of the second part CT13B of the first contact hole CT13 may be greater than those of the third and fourth parts CT13C and CT13D of the first contact hole CT13. The width of the first contact hole CT13 may reduce in a downward direction (i.e., a direction opposite to the third direction DR3), but the first contact hole CT13 may have a stepped shape in the second part CT13B and the third part CT13C of the first contact hole CT13.

The fourth part CT13D of the first contact hole CT13 formed by the sidewalls of the passivation layer 126 may not overlap the second conductive layer 140 in the third direction DR3. Specifically, the fourth part CT13D of the first contact hole CT13 may not overlap the first power line VL1 in the third direction DR3. For example, the fourth part CT13D of the first contact hole CT13 may not be interposed between the first power line VL1 and the first source/drain electrode SD1.

The first insulating layer 510 disposed on the connection pattern 230 may completely cover or overlap the connection pattern 230. The connection pattern 230 completely overlapped by the first insulating layer 510 may be electrically insulated from the first electrode 210 and the second electrode 220.

The second contact hole CT11 may expose at least a part of an upper surface of the second source/drain electrode SD2 of the first conductive layer 130 and a side surface and a part of an upper surface of the first conductive pattern CP1 of the second conductive layer 140. The first electrode 210 may electrically contact the side surface of the first conductive pattern CP1, the part of the upper surface of the first conductive pattern CP1, and the part of the upper surface of the second source/drain electrode SD2 exposed through the second contact hole CT11 in the third direction DR3.

The second contact hole CT11 may include a first part CT11A formed by sidewalls of the first subbank 410, a second part CT11B formed by sidewalls of the via layer 127, a third part CT11C formed by a side surface of the first conductive pattern CP1 and a sidewall of the via layer 127, and a fourth part CT11D formed by sidewalls of the passivation layer 126. The first to fourth parts CT11A to CT11D of the second contact hole CT11 may be integral with each other to form a hole.

A width of the first part CT11A of the second contact hole CT11 may be greater than those of the second to fourth parts CT11B to CT of the second contact hole CT11. The width of the second part CT11B of the second contact hole CT11 may be greater than those of the third and fourth parts CT11C and CT of the second contact hole CT11. The width of the second contact hole CT11 may reduce in the downward direction (i.e., the direction opposite to the third direction DR3), but the second contact hole CT11 may have a stepped shape in the second part CT11B and the third part CT11C of the second contact hole CT11.

The fourth part CT of the second contact hole CT11 formed by the sidewalls of the passivation layer 126 may not overlap the second conductive layer 140 in the third direction DR3. Specifically, the fourth part CT of the second contact hole CT11 may not overlap the first conductive pattern CP1 in the third direction DR3. For example, the fourth part CT11D of the second contact hole CT11 may not be interposed between the first conductive pattern CP1 and the second source/drain electrode SD2.

The first insulating layer 510 disposed on the first electrode 210 may include the fourth opening OP21 exposing at least a part of a surface of the first electrode 210. The first contact electrode 710 and the first electrode 210 may be electrically connected to each other through the fourth opening OP21.

Figure 5:
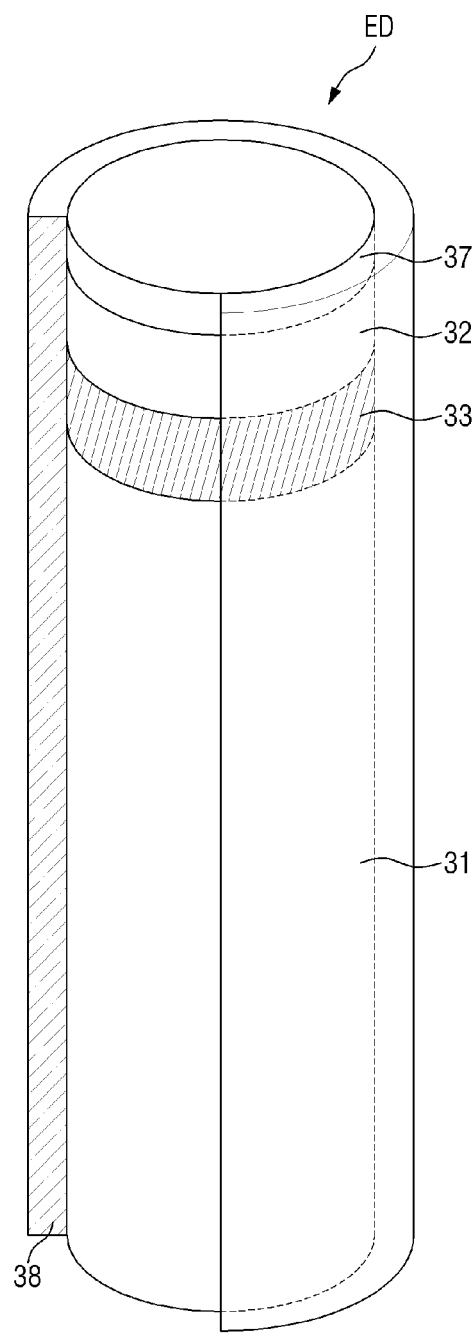
FIG. 5 is a schematic perspective view of a light emitting element according to an embodiment.

FIG. 5 is a schematic view of a light emitting element ED according to an embodiment.

Referring to FIG. 5, the light emitting element ED may be a particulate element and may be shaped like a rod or a cylinder having an aspect ratio. A length of the light emitting element ED may be greater than a diameter of the light emitting element ED, and the aspect ratio of the light emitting element ED may be, but is not limited to, about 6:5 to about 100:1.

The light emitting element ED may have a nanometer-scale size (about 1 nm to about 1 μm) or a micrometer-scale size (about 1 μm to about 1 mm). In an embodiment, both the diameter and length of the light emitting element ED may have a nanometer-scale size or a micrometer-scale size. In some embodiments, the diameter of the light emitting element ED may have a nanometer-scale size, whereas the length of the light emitting element ED may have a micrometer-scale size. In some embodiments, some of light emitting elements ED may have a nanometer-scale size in diameter and/or length, whereas others of the light emitting elements ED may have a micrometer-scale size in diameter and/or length.

In an embodiment, the light emitting element ED may be an inorganic LED. The inorganic LED may include semiconductor layers. For example, the inorganic LED may include a first conductivity type (e.g., n-type) semiconductor layer, a second conductivity type (e.g., p-type) semiconductor layer, and an active semiconductor layer interposed between them. The active semiconductor layer may receive holes and electrons respectively from the first conductivity type semiconductor layer and the second conductivity type semiconductor layer, and the holes and the electrons reaching the active semiconductor layer may combine together to emit light.

In an embodiment, the above-described semiconductor layers may be sequentially stacked in a longitudinal direction of the light emitting element ED. The light emitting element ED may include a first semiconductor layer 31, an element active layer 33, and a second semiconductor layer 32 sequentially stacked in the longitudinal direction as illustrated in FIG. 5. The first semiconductor layer 31, the element active layer 33, and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, or Sir. In an embodiment, the first semiconductor layer 31 may be n-GaN doped with n-type Si.

The second semiconductor layer 32 may be spaced apart from the first semiconductor layer 31 with the element active layer 33 interposed between them. The second semiconductor layer 32 may be doped with a second conductivity type dopant such as Mg, Zn, Ca, Se, or Ba. In an embodiment, the second semiconductor layer 32 may be p-GaN doped with p-type Mg.

The element active layer 33 may include a material having a single or multiple quantum well structure. As described above, the element active layer 33 may emit light through combination of electron-hole pairs according to electrical signals received through the first semiconductor layer 31 and the second semiconductor layer 32.

In some embodiments, the element active layer 33 may have a structure in which a semiconductor material having a large band gap energy and a semiconductor material having a small band gap energy are alternately stacked or may include different Group III to V semiconductor materials depending on the wavelength band of light that it emits.

Light emitted from the element active layer 33 may be emitted not only to an outer surface of the light emitting element ED in the longitudinal direction but also to both side surfaces thereof. For example, the direction of light emitted from the element active layer 33 is not limited to a direction.

The light emitting element ED may further include an element electrode layer 37 disposed on the second semiconductor layer 32. The element electrode layer 37 may contact the second semiconductor layer 32. The element electrode layer 37 may be an ohmic contact electrode. However, the disclosure is not limited thereto, and the element electrode layer 37 may also be a Schottky contact electrode.

In case that ends of the light emitting element ED are electrically connected to the first and second contact electrodes 710 and 720 to transmit electrical signals to the first semiconductor layer 31 and the second semiconductor layer 32, the element electrode layer 37 may be disposed between the second semiconductor layer 32 and the first contact electrode 710 to reduce the resistance between them. The element electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The element electrode layer 37 may also include a semiconductor material doped with n- or p-type dopants.

The light emitting element (or light emitting diode) ED may further include an insulating film 38 covering outer circumferential surfaces of the first semiconductor layer 31, the second semiconductor layer 32, the element active layer 33, and/or the element electrode layer 37. The insulating film 38 may surround the outer surface of at least the element active layer 33 and extend in the direction in which the light emitting element ED extends. The insulating film 38 may protect the abovementioned members (e.g., first semiconductor layer 31, the second semiconductor layer 32, the element active layer 33, and the element electrode layer 37). The insulating film 38 may be made of materials having insulating properties to prevent an electrical short circuit that may occur in case that the element active layer 33 directly contacts an electrode through which an electrical signal is transmitted to the light emitting element ED. Since the insulating film 38 protects the outer circumferential surfaces of the first and second semiconductor layers 31 and 33 as well as the element active layer 33, a reduction in luminous efficiency can be prevented.

Figure 6:
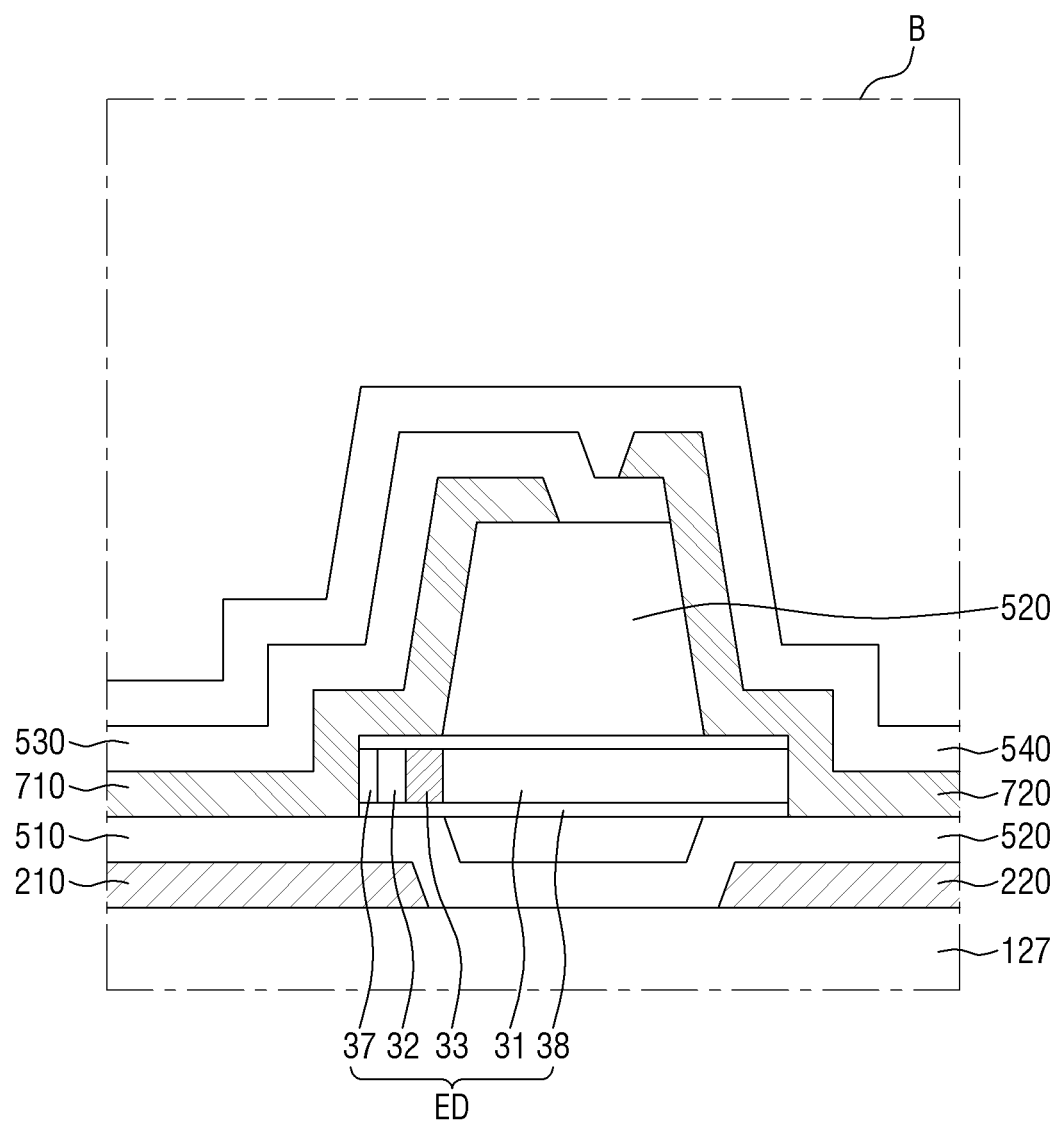
FIG. 6 is a schematic enlarged cross-sectional view of an example of area B of FIG. 3.

FIG. 6 is a schematic enlarged cross-sectional view of an example of area B of FIG. 3.

The contact relationship between ends of a light emitting element ED and the first and second contact electrodes 710 and 720 will now be described with reference to FIG. 6.

As described above, the light emitting element ED may include the first and second semiconductor layers 31 and 32 doped with dopants of different conductive types. The light emitting element ED including the first and second semiconductor layers 31 and 32 may be oriented such that the first end faces a specific direction according to the direction of an electric field generated on the first and second electrodes 210 and 220. Specifically, the light emitting element ED may extend in a direction, and ends of the light emitting element ED in the extending direction of the light emitting element ED may be disposed on the first electrode 210 and the second electrode 220.

The light emitting element ED may extend in a direction parallel to the substrate SUB, and semiconductor layers included in the light emitting element ED may be sequentially disposed in the direction parallel to an upper surface of the substrate SUB. Specifically, in a cross-sectional view across ends of the light emitting element ED, the first semiconductor layer 31, the element active layer 33, the second semiconductor layer 32, and the element electrode layer 37 may be sequentially formed in a direction horizontal to the surface of the substrate SUB. The light emitting element ED may be aligned such that the first end of the light emitting element ED at which the second semiconductor layer 32 is located lies on the first electrode 210, and the second end of the light emitting element ED at which the first semiconductor layer 31 is located lies on the second electrode 220. However, the disclosure is not limited thereto, and some light emitting elements ED may also be aligned such that the first end thereof at which the second semiconductor layer 32 is located lies on the second electrode 220, and the second end thereof at which the first semiconductor layer 31 is located lies on the first electrode 210.

Ends of the light emitting element ED exposed by the second insulating layer 520 may electrically contact the first contact electrode 710 and the second contact electrode 720, respectively.

The first contact electrode 710 may electrically contact the first end of the light emitting element ED. The first contact electrode 710 may electrically contact the element electrode layer 37 disposed at the first end of the light emitting element ED. The first contact electrode 710 may be electrically connected to the second semiconductor layer 32 through the element electrode layer 37 of the light emitting element ED.

The second contact electrode 720 may electrically contact the second end of the light emitting element ED. The second contact electrode 720 may electrically contact the first semiconductor layer 31 disposed at the second end of the light emitting element ED.

The first end of the light emitting element ED at which the second semiconductor layer 32 is located may be electrically connected to the first electrode 210 through the first contact electrode 710, and the second end of the light emitting element ED at which the first semiconductor layer 31 is located may be electrically connected to the second electrode 220 through the second contact electrode 720. For example, since ends of the light emitting element ED electrically contact the first contact electrode 710 and the second contact electrode 720, respectively, the light emitting element ED may receive electrical signals from the first and second electrodes 210 and 220, and light may be emitted from the element active layer 33 of the light emitting element ED according to the electrical signals.

Figure 7:
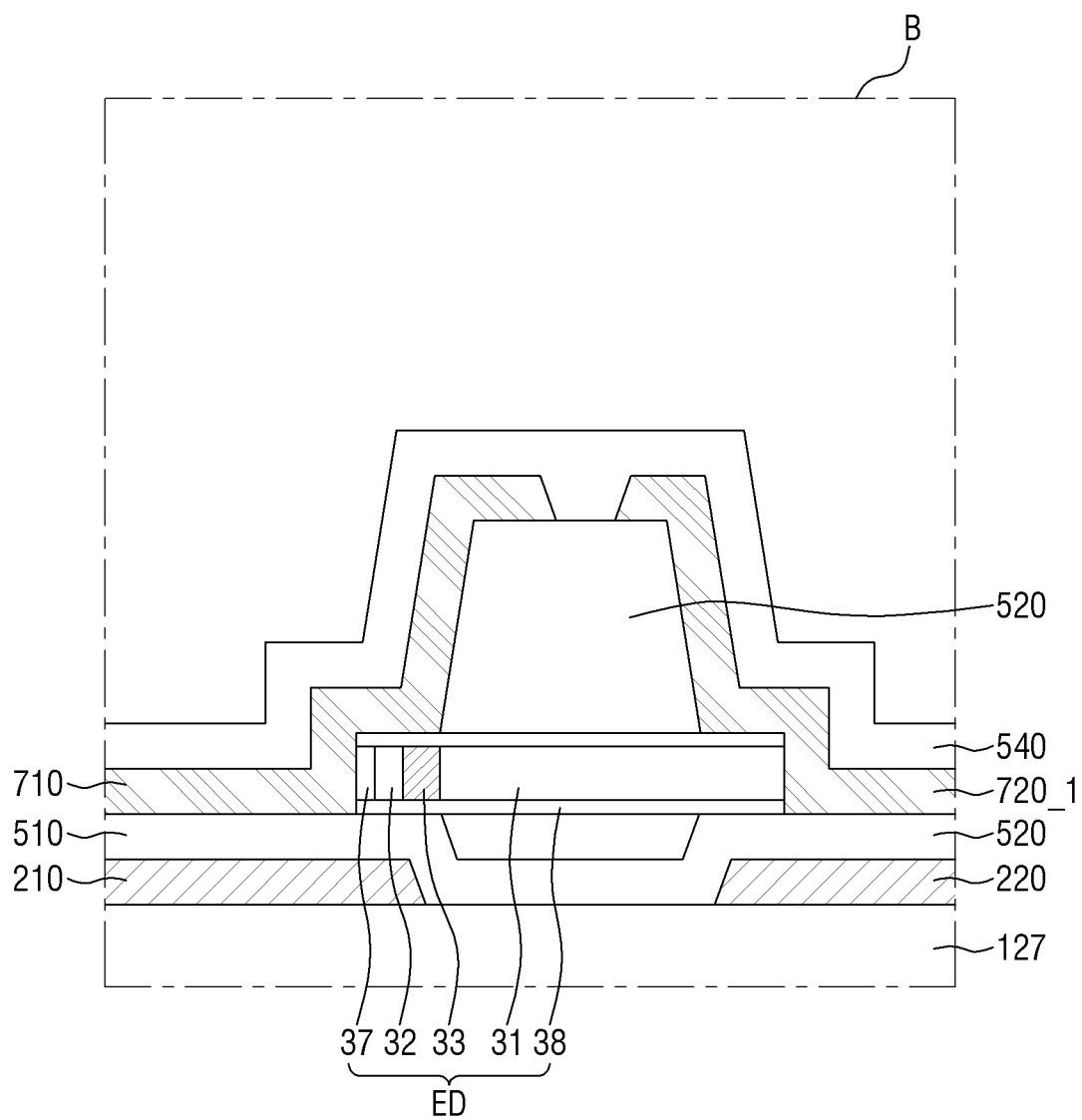
FIG. 7 is a schematic enlarged cross-sectional view of an example of area. B of FIG. 3.

FIG. 7 is a schematic enlarged cross-sectional view of an example of area B of FIG.

Referring to FIG. 7, the embodiment may be different from that of FIG. 6 at least in that the third insulating layer 530 is omitted.

Specifically, a first contact electrode 710 and a second contact electrode 720_1 may be directly disposed on a second insulating layer 520. The first contact electrode 710 and the second contact electrode 720_1 disposed on the second insulating layer 520 may be spaced apart from each other to expose a part of the second insulating layer 520. The second insulating layer 520 exposed by the first contact electrode 710 and the second contact electrode 720_1 may contact a fourth insulating layer 540 in an exposed area thereof.

In the embodiment, even if the third insulating layer 530 is omitted from the display device 10, the second insulating layer 520 including an organic insulating material may fix a light emitting element ED. The first contact electrode 710 and the second contact electrode 720_1 may be simultaneously formed by patterning in a mask process. Therefore, since no additional mask process is required to form the first contact electrode 710 and the second contact electrode 720_1, process efficiency can be improved. The embodiment may be identical to that of FIG. 6 except that the third insulating layer 530 is omitted, and thus repetitive descriptions thereof will be omitted.

FIGS. 8 to 15 are schematic cross-sectional views illustrating some of operations in a method of fabricating the display device 10 according to the embodiment of FIG. 3.

Figure 8:
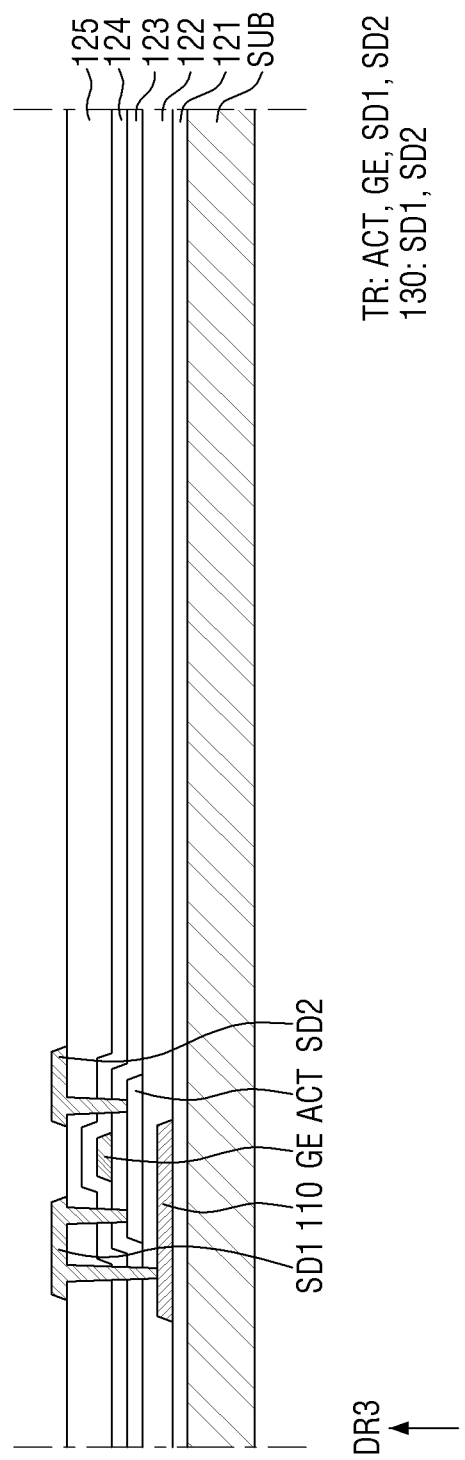
FIGS. 8 through 15 are schematic cross-sectional views illustrating some of the operations in a method of fabricating the display device according to the embodiment of FIG. 3.

Referring to FIG. 8, first, a transistor TR may be formed on a substrate SUIT. The forming of the transistor TR on the substrate SUB may include stacking a barrier layer 121 on a surface of the substrate SUB and forming a patterned bottom metal layer 110 on a surface of the barrier layer 121, stacking a buffer layer 122 on the bottom metal layer 110 and forming a semiconductor layer including an active layer ACT of the transistor TR on the buffer layer 122, stacking a gate insulating film 123 on the semiconductor layer and forming a gate conductive layer including a gate electrode GE of the transistor TR on the gate insulating film 123, stacking a first interlayer insulating film 124 and a second interlayer insulating film 125 on the gate conductive layer and forming contact holes, and forming a patterned first conductive layer 130 on the second interlayer insulating film 125.

The forming of the patterned bottom metal layer 110 on the surface of the barrier layer 121 may be achieved by a mask process. Specifically, a material layer for a bottom metal layer may be deposited on the entire surface of the barrier layer 121 formed on the surface of the substrate SUB. Then, a photoresist layer may be coated on the material layer for the bottom metal layer and formed into a photoresist pattern through exposure and development. After this, the material layer for the bottom metal layer may be etched using the photoresist pattern as an etch mask. Then, the photoresist pattern may be removed by a strip process or an ashing process.

Next, the buffer layer 122 may be formed on the entire surface of the barrier layer 121 on which the bottom metal layer 110 is formed, and the semiconductor layer may be formed on the buffer layer 122. The semiconductor layer may be formed by the same mask process. Although FIG. 8 illustrates only the active layer ACT of one transistor TR, the display device 10 may include a larger number of transistors as described above.

Subsequently, the gate insulating film 123 may be stacked on the buffer layer 122 on which the semiconductor layer is formed, and the patterned gate conductive layer may be formed on the gate insulating film 123. The patterned gate conductive layer may be formed by the same mask process. Specifically, a material layer for a gate conductive layer may be deposited on the entire surface of the gate insulating film 123. Then, a photoresist layer may be coated on the material layer for the gate conductive layer and formed into a photoresist pattern through exposure and development. After this, the material layer for the gate conductive layer may be etched using the photoresist pattern as an etch mask. Then, the photoresist pattern may be removed by a strip process or an ashing process to form the gate electrode GE of the transistor TR as illustrated in the drawings.

Next, the first interlayer insulating film 124 and the second interlayer insulating film 125 may be sequentially stacked on the gate insulating film 123 on which the patterned gate conductive layer is formed, and contact holes may be formed. The contact holes may include contact holes exposing parts of the active layer ACT of the transistor TR and a contact hole exposing a part of the bottom metal layer 110. The contact holes may be formed by the same mask process. For example, a photoresist pattern (contact hole patterns) partially exposing the bottom metal layer 110 and the active layer ACT may be formed on the second interlayer insulating film 125, and contact holes partially exposing the buffer layer 122, the gate insulating film 123, the first interlayer insulating film 124, and the second interlayer insulating film 125 may be formed using the photoresist pattern as an etch mask.

The contact hole exposing the bottom metal layer 110 and the contact holes exposing parts of the active layer ACT of the transistor TR may also be sequentially formed by different masks. The economic efficiency of the fabrication process of the display device 10 may be reduced by the addition of a mask process. However, since the active layer ACT of the transistor TR is not exposed to an etchant while the buffer layer 122 is etched to form the contact hole exposing the bottom metal layer 110, the surface of the active layer (or active material layer) ACT may not be damaged.

Next, the patterned first conductive layer 130 may be formed on the second interlayer insulating film 125. The first conductive layer 130 may be formed by the same mask process. Specifically, a material layer for a first conductive layer may be deposited on the entire surface of the second interlayer insulating film 125. In the deposition process, the material layer for the first conductive layer may be deposited into the contact holes and thus connected to the bottom metal layer 110 and the active layer ACT of the transistor TR. Then, a photoresist layer may be coated on the material layer for the first conductive layer and formed into a photoresist pattern through exposure and development. After this, the material layer for the first conductive layer may be etched using the photoresist pattern as an etch mask. Then, the photoresist pattern may be removed by a strip process or an ashing process to form a first source/drain electrode SD1 of the transistor TR and a second source/drain electrode SD2 of the transistor TR as illustrated in the drawing.

Figure 9:
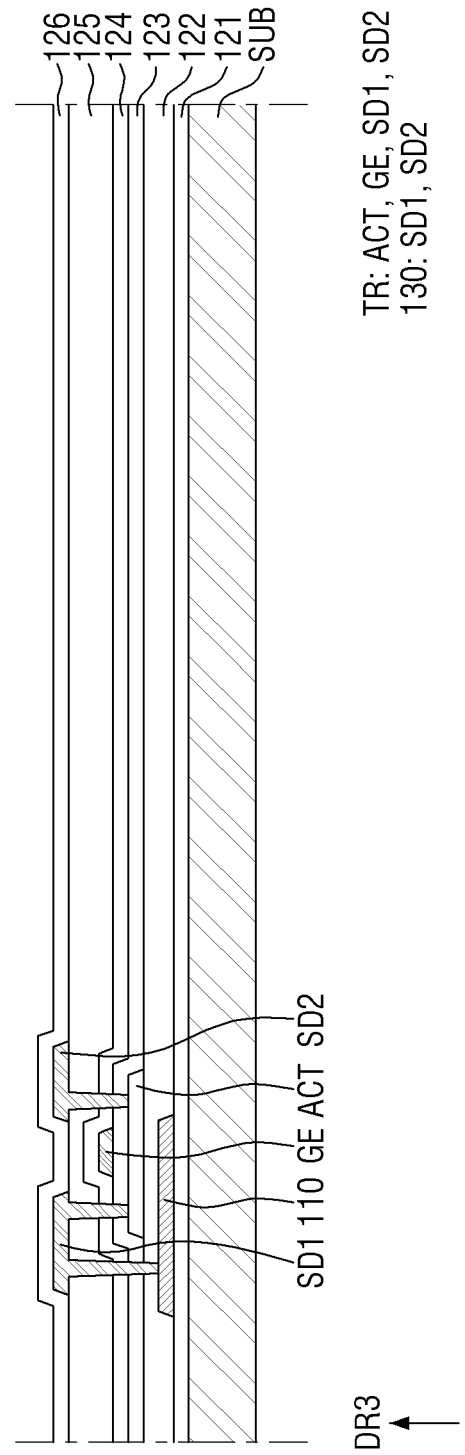

Next, referring to FIG. 9, a passivation layer 126 may be deposited on the entire surface of the second interlayer insulating film 125 on which the first conductive layer 130 is formed. In the embodiment, the passivation layer 126 may be deposited on the entire surface of the second interlayer insulating film 125 without a contact hole formed in the passivation layer 126. Therefore, a separate mask process for forming the passivation layer 126 can be omitted.

Figure 10:
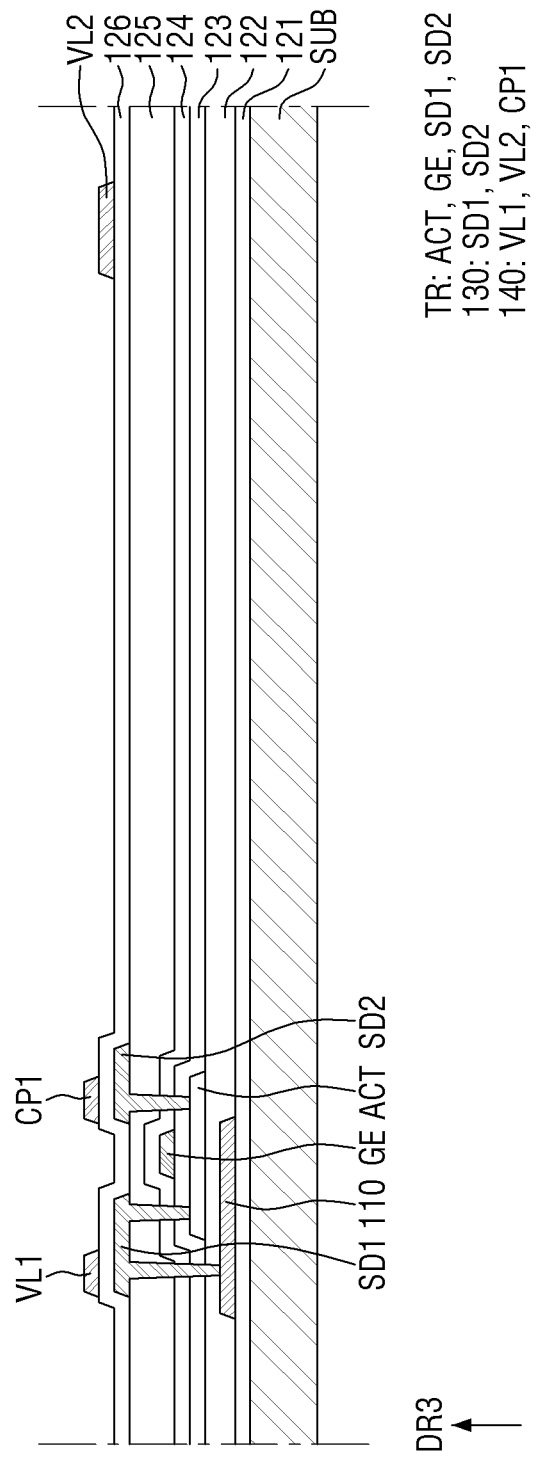

Next, referring to FIG. 10, a patterned second conductive layer 140 may be formed on the passivation layer 126. The second conductive layer 140 may be formed by the same mask process. Specifically, a material layer for a second conductive layer may be deposited on the entire surface of the passivation layer 126. Then, a photoresist layer may be disposed or coated on the material layer for the second conductive layer and formed into a photoresist pattern through exposure and development. After this, the material layer for the second conductive layer may be etched by using the photoresist pattern as an etch mask. Then, the photoresist pattern may be removed by a strip process or an ashing process to form a first power line VL1, a second power line VL2, and a first conductive pattern CP1 as illustrated in the drawing.

In the embodiment, the passivation layer 126 may be interposed between the second conductive layer 140 formed on the passivation layer 126 and the first conductive layer 130. Specifically, the first power line VL1 formed on the passivation layer 126 may overlap at least a part of the first source/drain electrode SD1 of the transistor TR in the third direction DR3 but may not overlap another part of the first source/drain electrode SD1 of the transistor TR in the third direction DR3. For example, the first power line VL1 may be disposed on the first source/drain electrode SD1 of the transistor TR to expose at least a part of the first source/drain electrode SD1 of the transistor TR in the third direction DR3. The passivation layer 126 may be interposed between the first source/drain electrode SD1 of the transistor TR and the first power line VL1. Likewise, the first conductive pattern CP1 formed on the passivation layer 126 may overlap at least a part of the second source/drain electrode SD2 of the transistor TR in the third direction. DR3 but may not overlap another part of the second source/drain electrode SD2 of the transistor TR in the third direction DR3. For example, the first conductive pattern CP1 may be disposed on the second source/drain electrode SD2 of the transistor TR to expose at least a part of the second source/drain electrode SD2 of the transistor TR in the third direction DR3. The passivation layer 126 may be interposed between the second source/drain electrode SD2 of the transistor TR and the first conductive pattern CP1.

Figure 11:
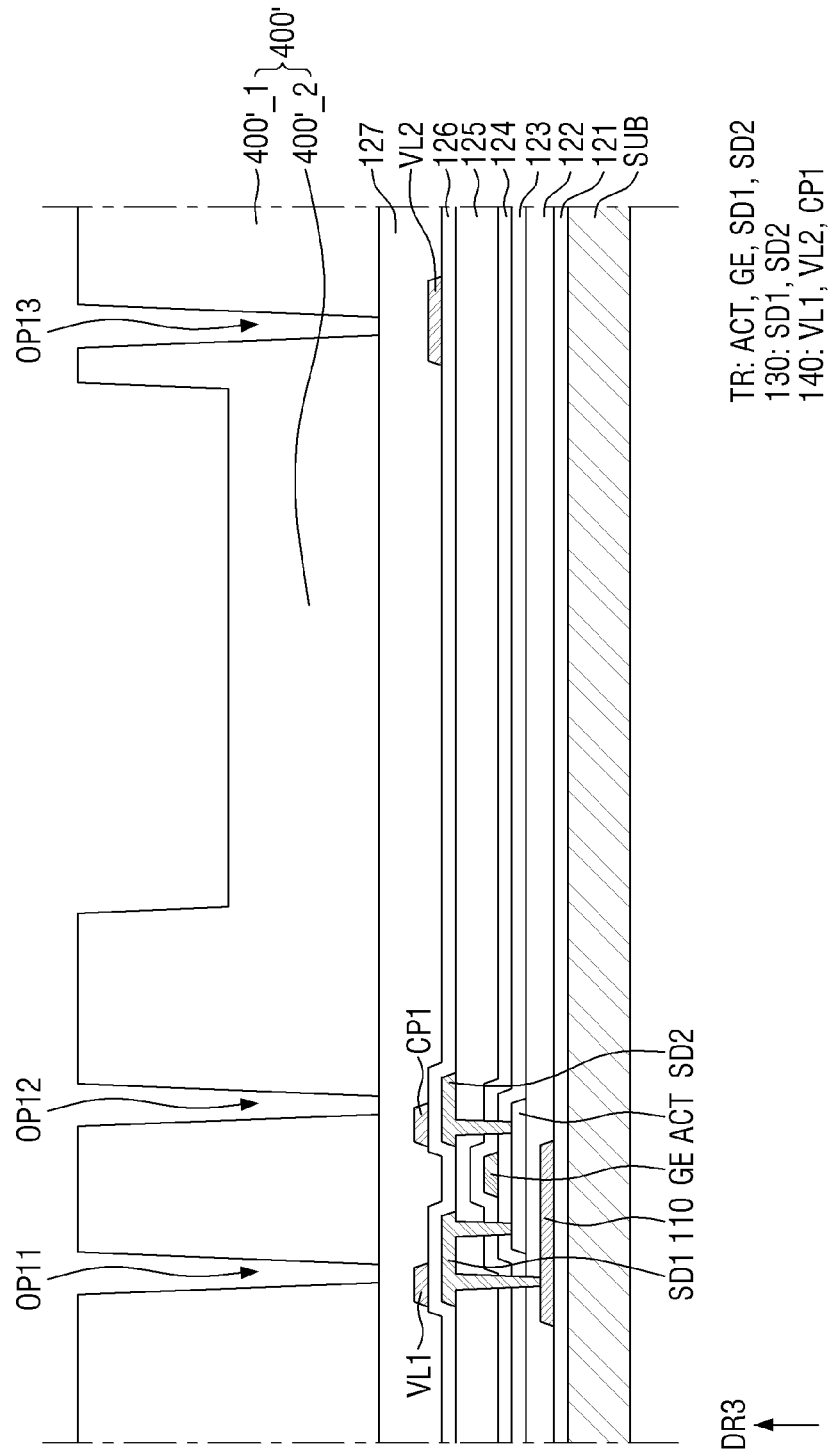

Next, referring to FIG. 11, a via layer 127 may be deposited on the entire surface of the passivation layer 126 on which the second conductive layer 140 is formed, and a patterned first bank layer 400' may be formed on the via layer 127. The patterned first bank layer 400' may have a generally flat surface but may have a different height in each area. For example, a height of a first area 400'_2 of the first bank layer 400' in which light emitting elements ED are disposed may be smaller than that of a second area 400'_1 of the first bank layer 400' in which the light emitting elements ED are not disposed.

The patterned first bank layer 400' may include first to third openings OP11 to OP13 overlapping the first power line VL1, the first conductive pattern CP1, and the second power line VL2 in the third direction DR3, respectively. The first opening OP11 may overlap a boundary area between the first power line VL1 and the first source/drain electrode SD1 in a plan view. The second opening OP12 may overlap a boundary area between the first conductive pattern CP1 and the second source/drain electrode SD2 in a plan view. The third opening OP13 may overlap the second power line VL2 in a plan view.

The patterned first bank layer 400' may be made of (or include), for example, an organic material including a photosensitive material. The patterned first bank layer 400' may be formed by coating an organic material layer for a first bank layer on the entire surface of the via layer 127 and then forming the first to third openings OP11 to OP13 through exposure and development. The patterned first bank layer 400' having a different height in each area may be formed using a halftone mask or a slit mask.

Figure 12:
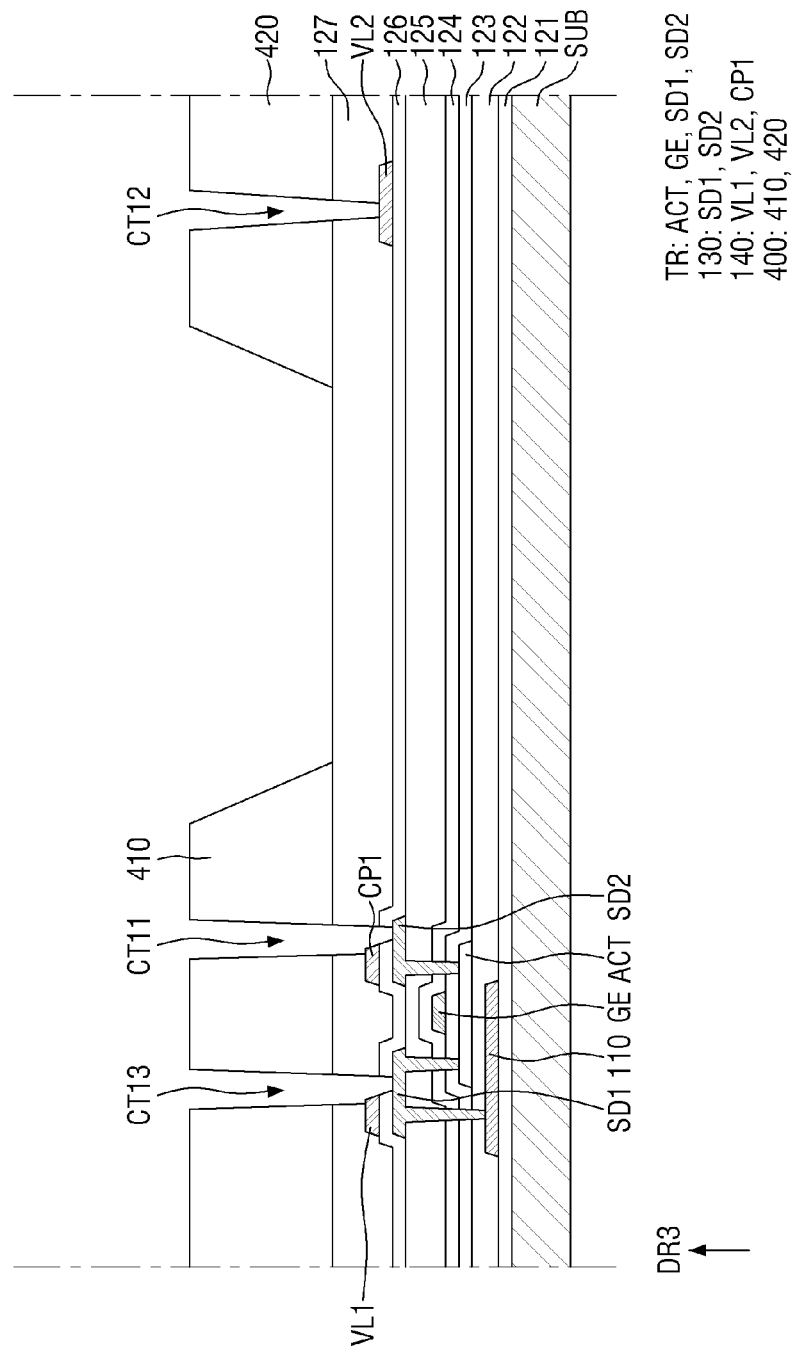

Next, referring to FIG. 12, a first subbank 410 and a second subbank 420 may be formed to include first to third contact holes CT13, CT11, and CT12 partially exposing the first conductive layer 130 and/or the second conductive layer 140. The contact holes CT13, CT11, and CT12 may include first to third contact holes CT13, CT11, and CT12. The second contact hole CT11 may partially expose the first conductive pattern CP1 and the second source/drain electrode SD2, the third contact hole CT12 may partially expose the second power line VL2, and the first contact hole CT13 may partially expose the first power line VL1 and the first source/drain electrode SD1.

The contact holes CT11 to CT13 may be formed by an etching process using the patterned first bank layer 400' as an etch mask without a separate mask process. Specifically, the via layer 127 and the passivation layer 126 exposed by the first opening OP11 of FIG. 11 may be etched by the etching process to form the first contact hole CT13 exposing the first power line VL1 and the first source/drain electrode SD1. The via layer 127 and the passivation layer 126 exposed by the second opening OP12 of FIG. 11 may be etched to form the second contact hole CT11 exposing the first conductive pattern CP1 and the second source/drain electrode SD2. The via layer 127 exposed by the third opening OP13 of FIG. 11 may be etched to form the third contact hole CT12 exposing the second power line VL2. Further, the first area 400'_2 of the first bank layer 400' may be removed to expose the via layer 127 overlapped by the first area 400'_2 of the first bank layer 400'. In an embodiment, the etching process for forming the contact holes CT11 to CT13 may be a dry etching process.

In an embodiment, the etching process for forming the contact holes CT11 to CT13 may be performed in a step. For example, the second contact hole CT11 penetrating the via layer 127 and the passivation layer 126 to expose the first conductive pattern CP1 and the second source/drain electrode SD2, the first contact hole CT13 penetrating the via layer 127 and the passivation layer 126 to expose the first power line VL1 and the first source/drain electrode SD1, and the third contact hole CT12 penetrating the via layer 127 to expose the second power line VL2 may be formed by an etching process in a step using the patterned first bank layer 400' as an etch mask.

In some embodiments, the etching process for forming the contact holes CT11 to CT13 may be sequentially performed in two steps. For example, an etching process for forming contact holes penetrating the via layer 127 to expose parts of upper and side surfaces of the first conductive pattern CP1 and the first power line VL1 and a part of an upper surface of the second power line VL2 may be performed using the patterned first bank layer 400' as an etch mask. Then, contact holes penetrating the passivation layer 126 to expose the first and second source/drain electrodes SD1 and SD2 may be formed by changing process conditions. As a result, the contact holes CT11 to CT13 may be formed.

Figure 13:
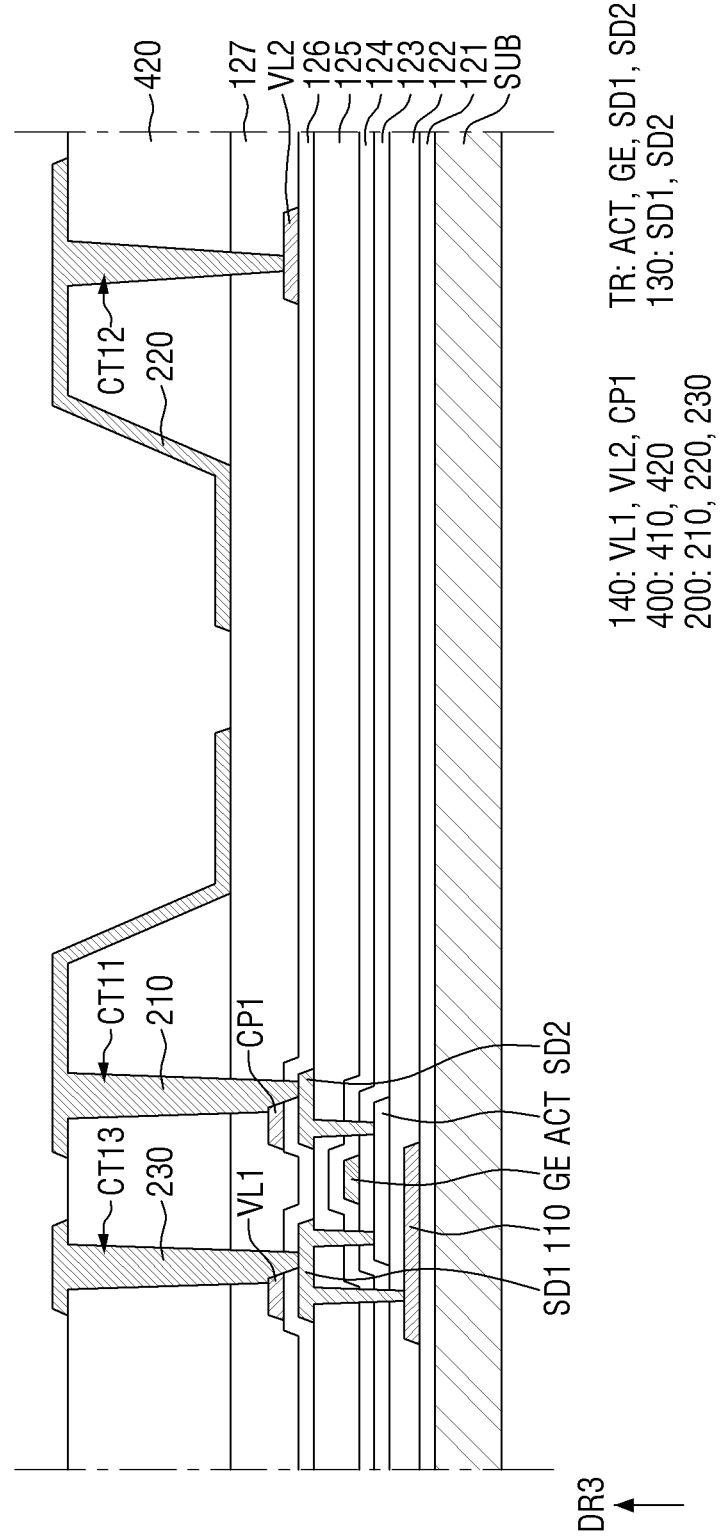

Next, referring to FIG. 13, a patterned third conductive layer 200 may be formed on the first and second subbanks 410 and 420. The third conductive layer 200 may be formed by the same mask process. Specifically, a material layer for a third conductive layer may be deposited on the entire surface of a first bank 400. In the deposition process, the material layer for the third conductive layer may be deposited into the first to third contact holes CT13, CT11, and CT12 and thus connected to the first conductive layer 130 and the second conductive layer 140. Specifically, in the deposition process, the material layer for the third conductive layer may be deposited into the second contact hole CT11 to electrically contact the second source/drain electrode SD2 of the first conductive layer 130 and the first conductive pattern CP1 of the second conductive layer 140. In the deposition process, the material layer for the third conductive layer may be deposited into the third contact hole CT12 to electrically contact the second power line VL2 of the second conductive layer 140. In the deposition process, the material layer for the third conductive layer may be deposited into the first contact hole CT13 to electrically contact the first source/drain electrode SD1 of the first conductive layer 130 and the first power line VL1 of the second conductive layer 140.

Then, a photoresist layer may be coated on the material layer for the third conductive layer and formed into a photoresist pattern through exposure and development. After this, the material layer for the third conductive layer may be etched using the photoresist pattern as an etch mask. Then, the photoresist pattern may be removed by a strip process or an aching process to form a first electrode 210, a second electrode 220, and a connection pattern 230 as illustrated in FIG. 13.

Figure 14:
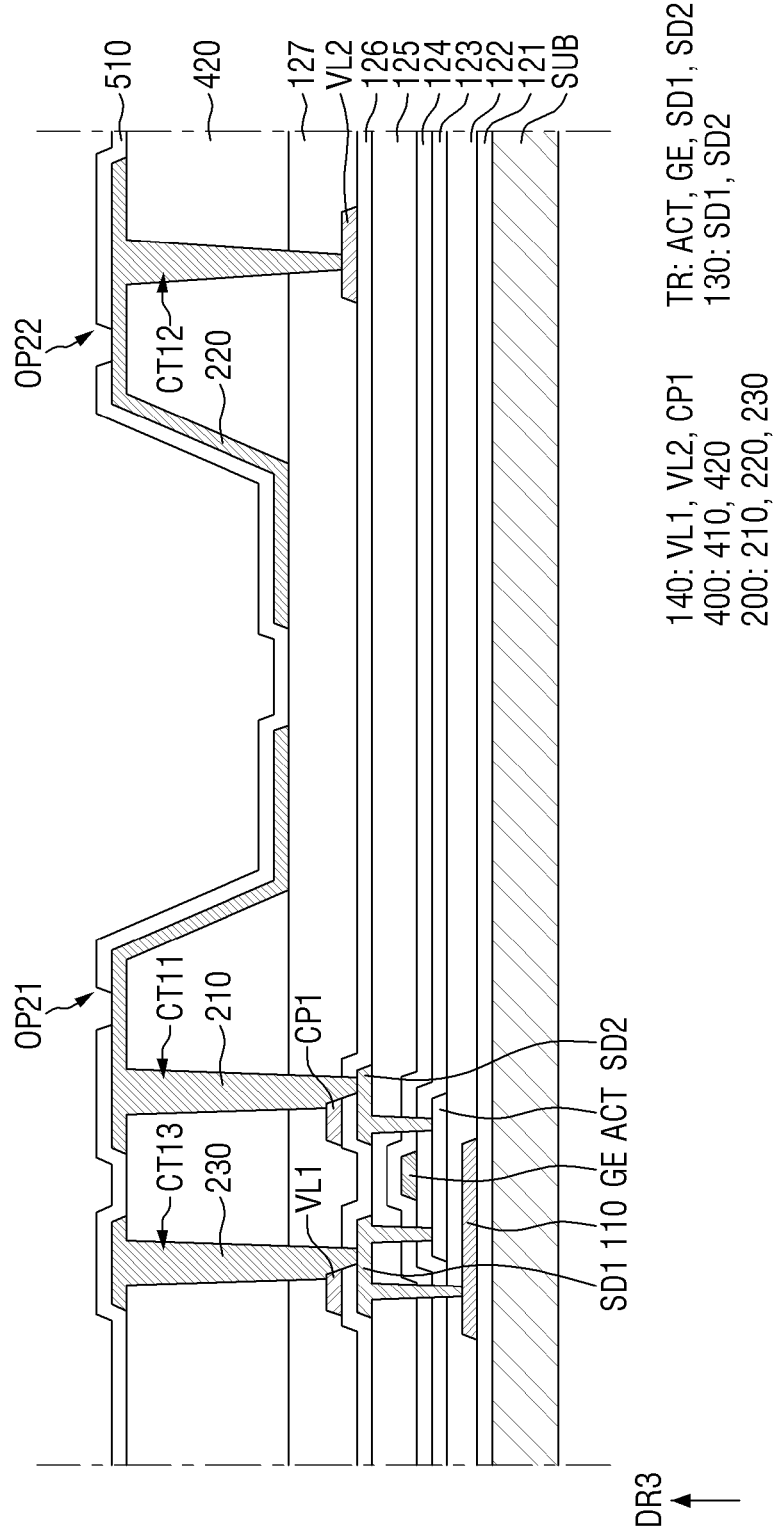

Next, referring to FIG. 14, a first insulating layer 510 may be stacked on the first bank 400 on which the patterned third conductive layer 200 is formed, and openings OP21 and OP22 may be formed. The openings OP21 and OP22 may include a fourth opening OP21 exposing a part of the first electrode 210 and a fifth opening OP22 exposing a part of the second electrode 220. The first insulating layer 510 may be disposed on the third conductive layer 200 to generally overlap the third conductive layer 200 but may expose at least a part of each of the first and second electrodes 210 and 220. The first insulating layer 510 may be disposed on the connection pattern 230 to completely overlap the connection pattern 230. The first electrode 210, the second electrode 220, and the connection pattern 230 may be insulated from each other by the first insulating layer 510.

Figure 15:
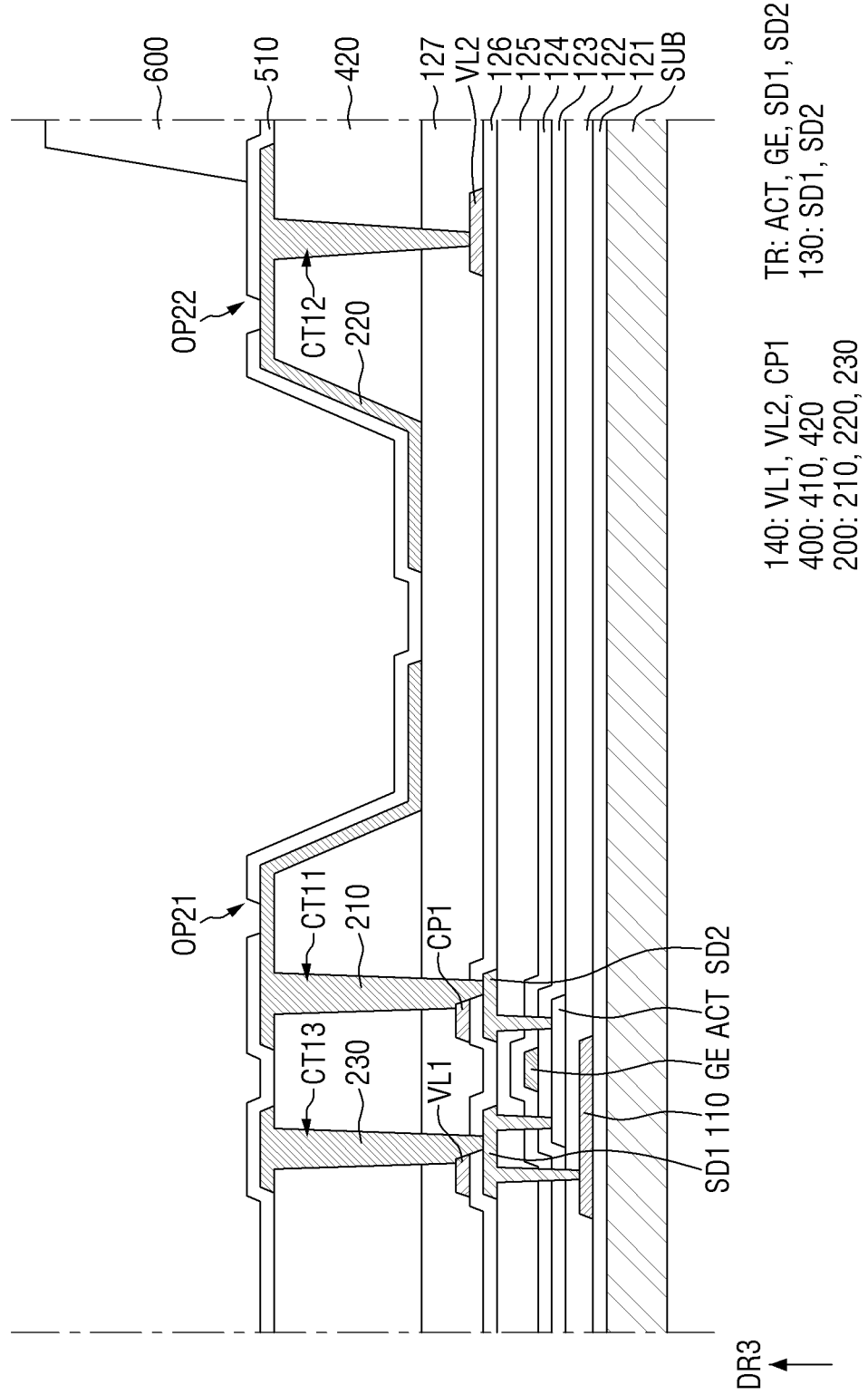

Next, referring to FIG. 15, a second bank 600 may be formed on the first insulating layer 510. The second bank 600 may prevent ink in which the light emitting elements ED are dispersed from overflowing into neighboring pixels PX in an inkjet process for aligning the light emitting elements ED.

Next, by a conventional process, the light emitting elements ED, a second insulating layer 520, a first contact electrode 710, a third insulating layer 530, a second contact electrode 720, and a fourth insulating layer 540 may be formed as illustrated in FIG. 3.

According to the method of fabricating a display device according to the embodiment, a first conductive layer, a passivation layer disposed on a surface of the first conductive layer, a second conductive layer disposed on the passivation layer, a via layer disposed on the second conductive layer, and a third conductive layer disposed on the via layer may be used as a connection electrode that electrically connects the first conductive layer and the second conductive layer. Therefore, in a process of forming the passivation layer interposed between the first conductive layer and the second conductive layer, a separate mask process for forming a contact hole that penetrates the passivation layer and connects the first conductive layer and the second conductive layer may be omitted. Therefore, since an additional mask process for connecting the first conductive layer and the second conductive layer may not be required, the process efficiency of the display device can be improved.

Figure 16:
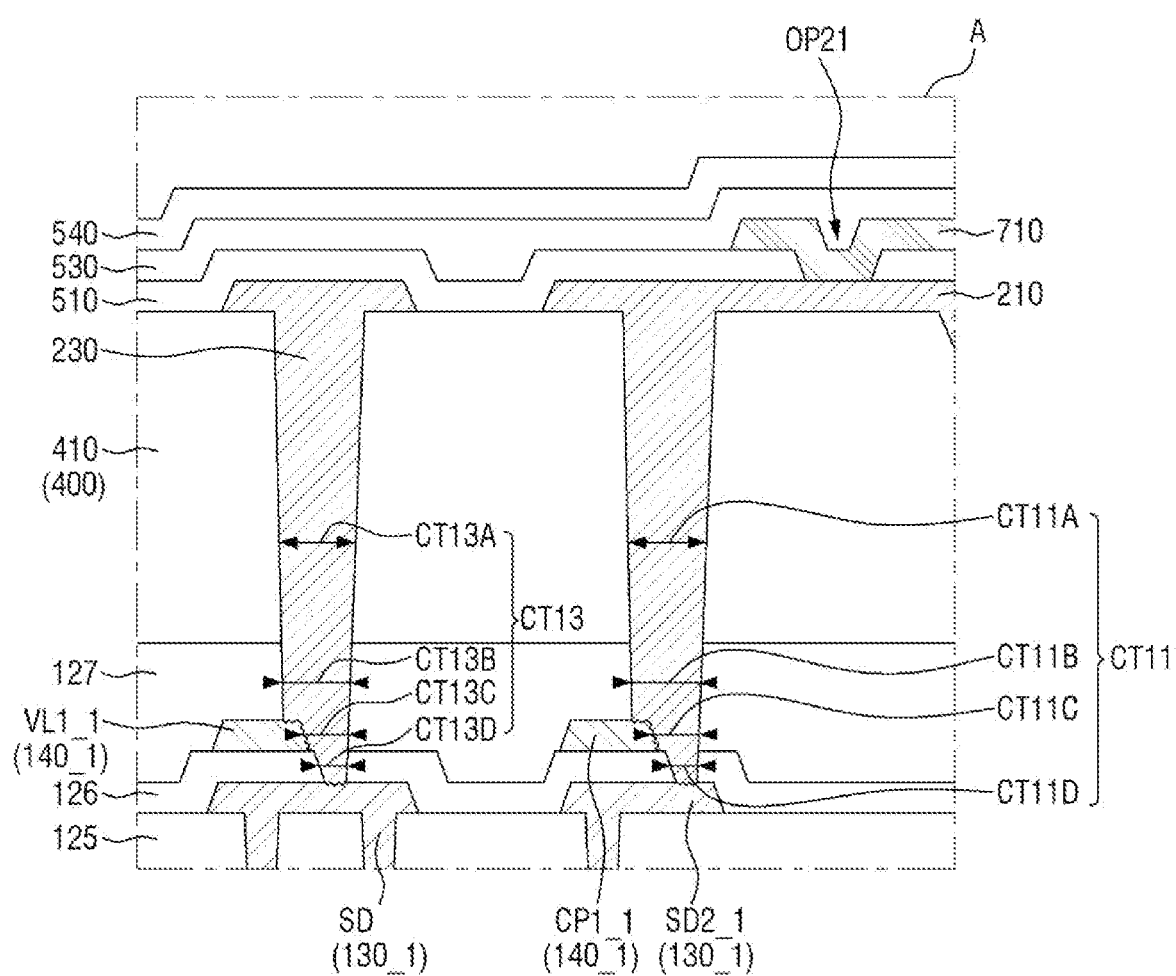
FIG. 16 is a schematic enlarged cross-sectional view of an example of area A of FIG. 3.

FIG. 16 is a schematic enlarged cross-sectional view of an example of area A of FIG. 3.

Referring to FIG. 16, the embodiment may be different from that of FIG. 4 at least in that a part of a second conductive layer 140_1 and a part of a first conductive layer 130_1 exposed by a second contact hole CT11 and a first contact hole CT13 have a predetermined roughness on their surfaces.

Specifically, as described above, the second contact hole CT11 may expose a part of an upper surface of a second source/drain electrode SD2_1 of the first conductive layer 130_1 and parts of upper and side surfaces of a first conductive pattern CP1_1 of the second conductive layer 140_1. A predetermined surface roughness may be formed on the part of the upper surface of the second source/drain electrode SD2_1 and the parts of the upper and side surfaces of the first conductive pattern CP1_1 exposed by the second contact hole CT11. The surface roughness may be formed in case that a part of the surface of the second source/drain electrode SD2_1 and/or the first conductive pattern CP1_1 is damaged by exposure to an etchant used in an etching process for forming the second contact hole CT11.

Likewise, the first contact hole CT13 may expose a part of an upper surface of a first source/drain electrode SD1_1 of the first conductive layer 130_1 and parts of upper and side surfaces of a first power line VL1_1 of the second conductive layer 140_1. A predetermined surface roughness may be formed on the part of the upper surface of the first source/drain electrode SD11 and the parts of the upper and side surfaces of the first power line VL11 exposed by the first contact hole CT13. The surface roughness may be formed in case that a part of the surface of the first source/drain electrode SD1_1 and/or the first power line VL1_1 is damaged by exposure to an etchant used in an etching process for forming the first contact hole CT13.

Although not illustrated in the drawing, a predetermined surface roughness may also be formed on a part of an upper surface of a second power line of the second conductive layer 140_1 exposed by a third contact hole CT12.

Figure 17:
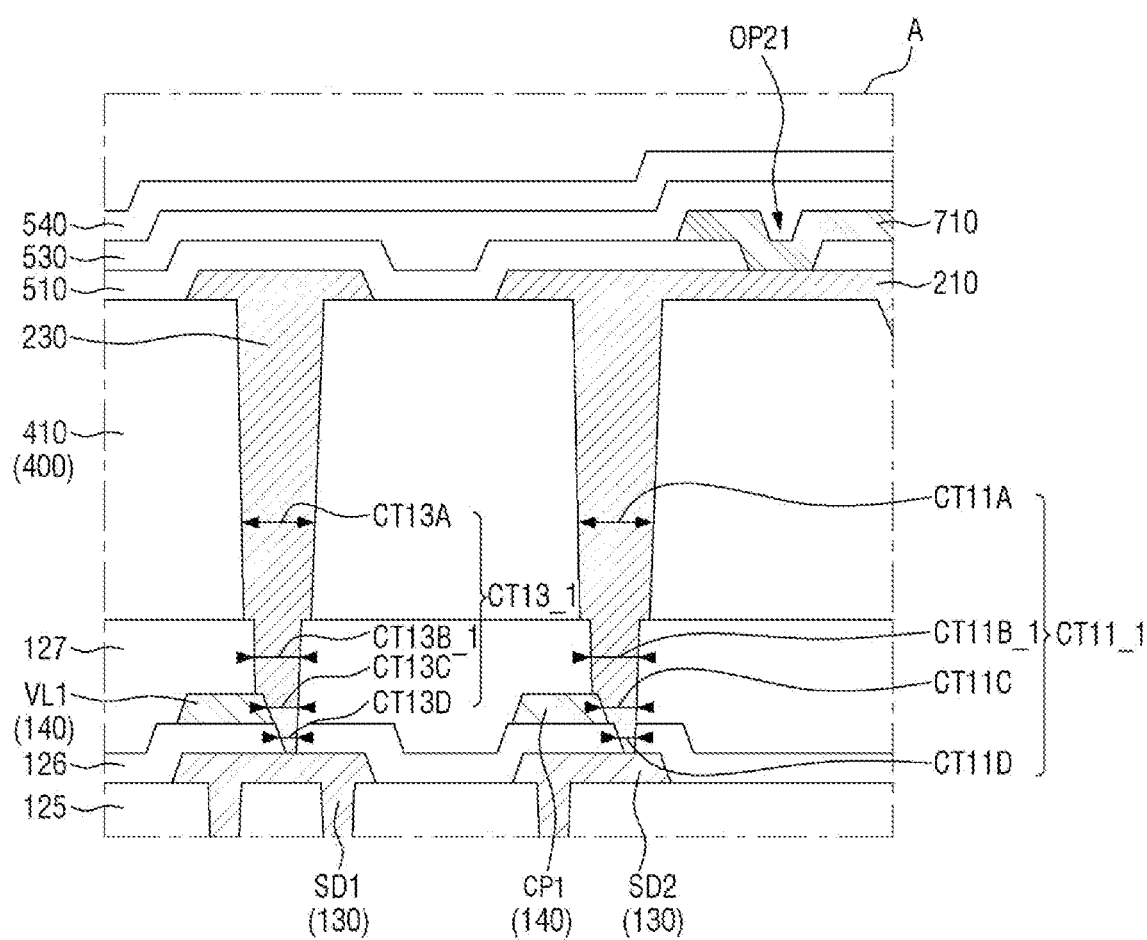
FIG. 17 is a schematic enlarged cross-sectional view of an example of area A of FIG. 3.

FIG. 17 is a schematic enlarged cross-sectional view of an example of area A of FIG. 3.

Referring to FIG. 17, the embodiment may be different from that of FIG. 4 at least n that sidewalls constituting first and second contact holes CT13_1 and CT11_1 are not aligned with each other.

Specifically, sidewalls of a first part CT11A of the second contact hole CT11_1 and sidewalls of a second part CT11B_1 of the second contact hole CT11_1 may not be aligned with each other. For example, the sidewalls of the second part CT11B_1 of the second contact hole CT11_1 may protrude further outward than those of the first part CT11A of the second contact hole CT11_1. Likewise, sidewalls of a first part CT13A of the first contact hole CT13_1 and sidewalls of a second part CT13B_1 of the first contact hole CT13_1 may not be aligned with each other. For example, the sidewalls of the second part CT13B_1 of the first contact hole CT13_1 may protrude further outward than those of the first part CT13A of the first contact hole CT13_1. The structure according to the embodiment may be formed because of a different etch selectivity of each member with respect to an etchant used in an etching process for forming contact holes CT11_1, CT12 and CT13_1.

Figure 18:
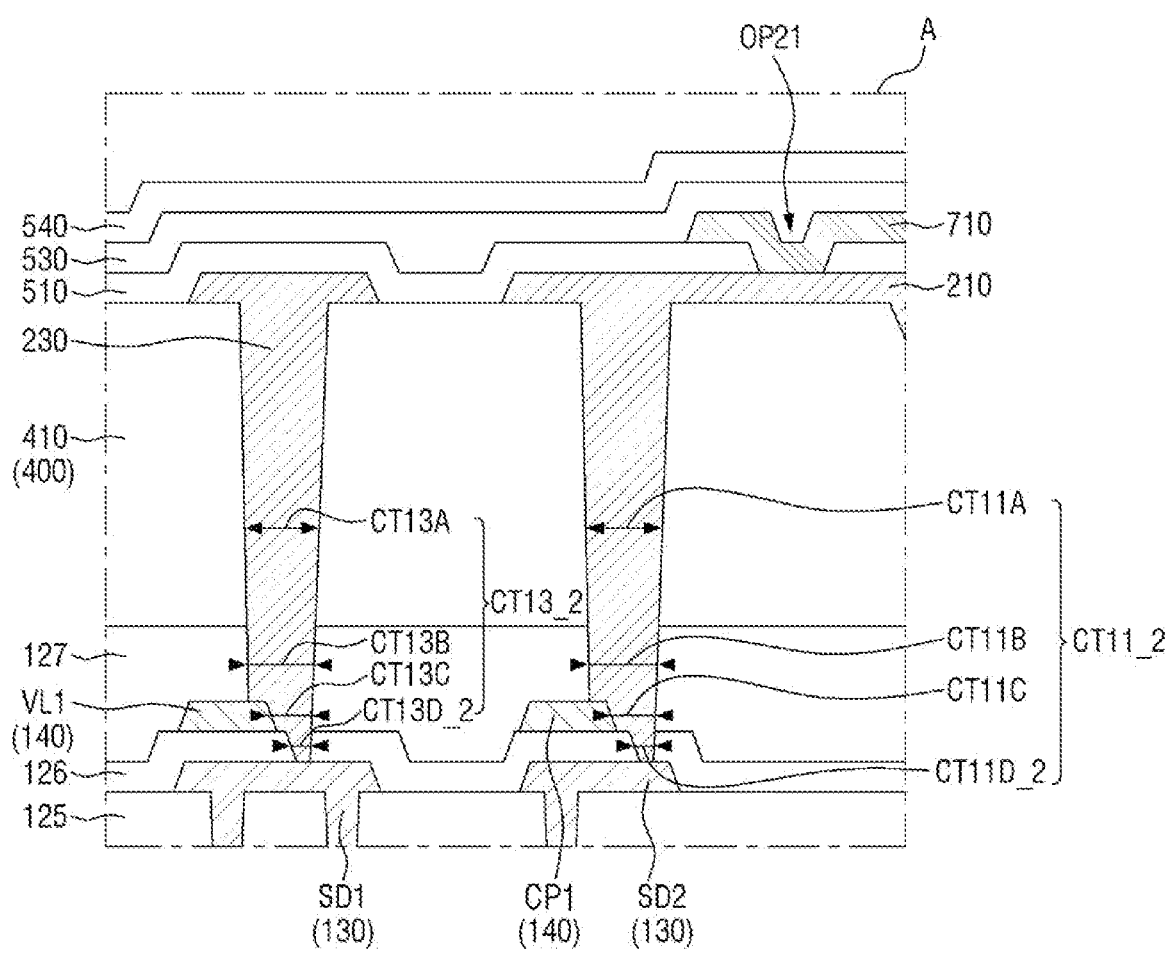
FIG. 18 is a schematic enlarged cross-sectional view of an example of area A of FIG. 3.

FIG. 18 is a schematic enlarged cross-sectional view of an example of area A of FIG. 3.

Referring to FIG. 18, the embodiment may be different from that of FIG. 4 at least in that sidewalls of parts forming (or constituting) first and second contact holes CT13_2 and CT11_2 are not aligned with each other.

Specifically, sidewalls of a third part CT11C and a fourth part CT11D_2 of the second contact hole CT11_2 may not be aligned with each other. For example, the sidewalls of the fourth part CT11D_2 of the second contact hole CT11_2 may protrude further outward than those of the third part CT11C of the second contact hole CT11_2. Likewise, sidewalls of a third part CT13C of the first contact hole CT13_2 and sidewalls of a fourth part CT13D_2 of the first contact hole CT13_2 may not be aligned with each other. For example, the sidewalls of the fourth part CT13D_2 of the first contact hole CT13_2 may protrude further outward than those of the third part CT13C of the first contact hole CT13_2. The structure according to the embodiment may be formed because of a different etch selectivity of each member with respect to an etchant used in an etching process for forming contact holes CT11_2, CT12 and CT13_2.

Figure 19:
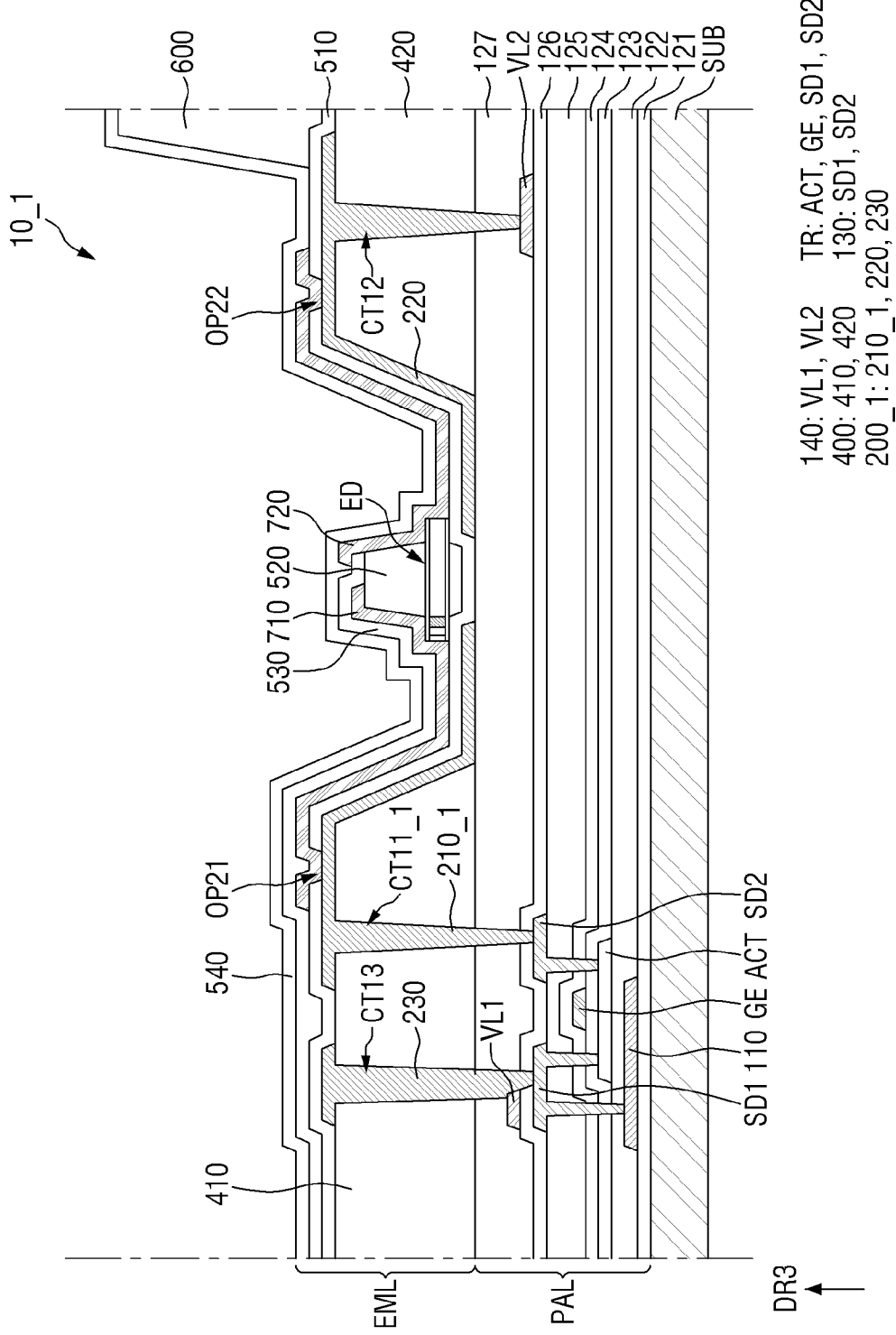
FIG. 19 is a schematic cross-sectional view of a display device according to an embodiment.

FIG. 19 is a schematic cross-sectional view of a display device 10_1 according to an embodiment.

Referring to FIG. 19, the display device 10_1 according to the embodiment may be different from the display device 10 of FIG. 3 at least in that a second conductive layer 140 does not include a first conductive pattern. CP1.

Specifically, a first electrode 210_1 included in the display device 10_1 according to the embodiment may electrically contact a second source/drain electrode SD2 of a transistor TR through a second contact hole CT11_1 penetrating a first subbank 410, a via layer 127, and a passivation layer 126. The second contact hole CT11_1 may penetrate the first subbank 140, the via layer 127, and the passivation layer 126 to expose a part of an upper surface of the second source/drain electrode SD1 The second source/drain electrode SD2 may be electrically connected to the first electrode 210_1 through the second contact hole CT11_1.

Figure 20:
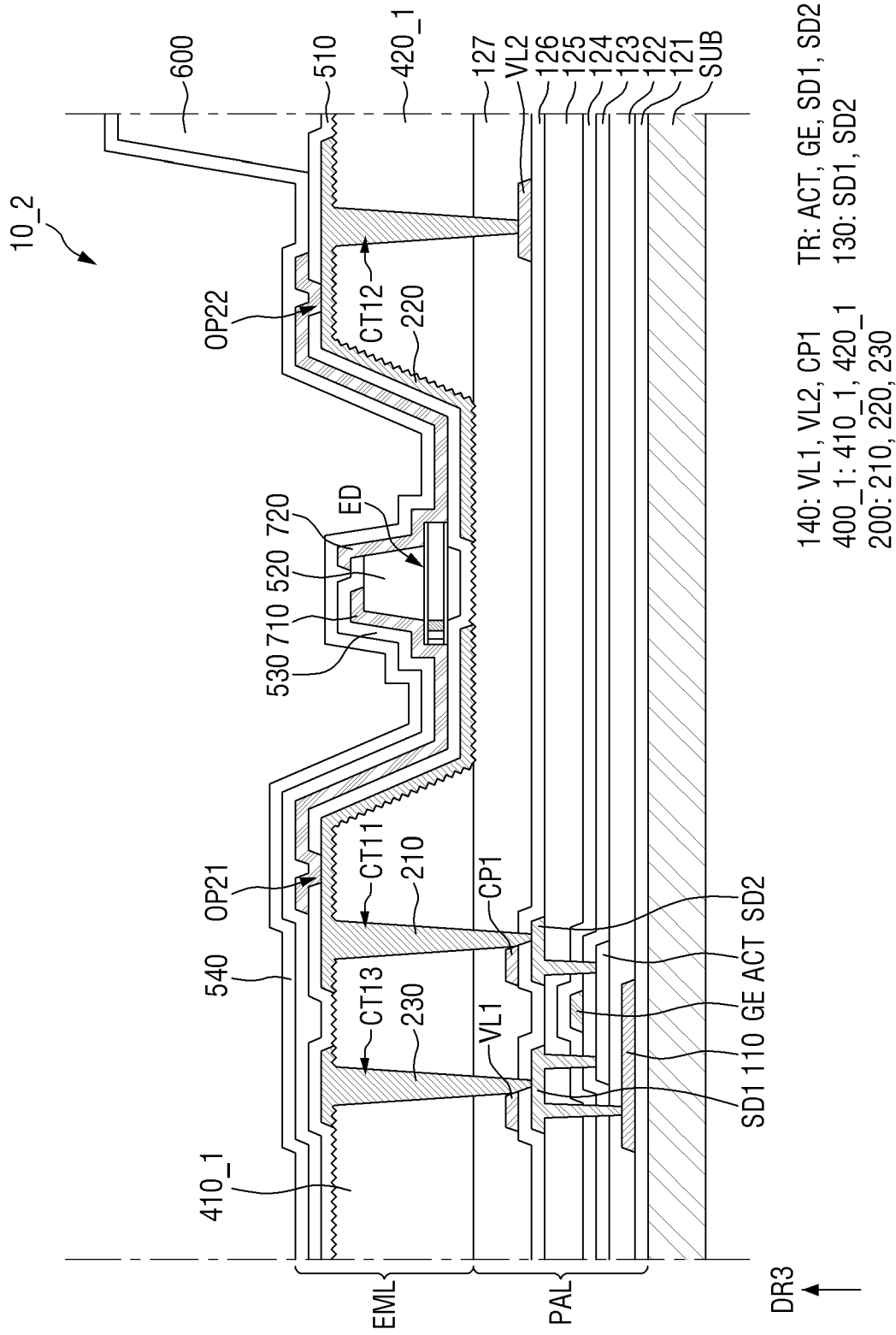
FIG. 20 is a schematic cross-sectional view of a display device according to an embodiment.

FIG. 20 is a schematic cross-sectional view of a display device 10_2 according to an embodiment.

Referring to FIG. 20, the display device 10_2 according to the embodiment may be different from the display device 10 of FIG. 3 at least in that a surface roughness is formed on an outer surface of a first bank 400_1 and an upper surface of a via layer 127 exposed by the first bank 4001.

Specifically, a roughness may be formed on the outer surface of the first bank 400_1. For example, the outer surface of the first bank 400_1 may include upper and side surfaces of each of first and second subbanks 410_1 and 420_1. A predetermined surface roughness may be formed on the upper and side surfaces of each of the first and second subbanks 410_1 and 420_1. The predetermined roughness may be formed on the upper surface of the via layer 127 exposed by the first subbank 410_1 and the second subbank 420_1.

The predetermined surface roughness formed on the first bank 400_1 and the outer surface of the via layer 127 exposed by the first bank 400_1 may be formed in an etching process for forming first to third contact holes CT13, CT11, and CT12. For example, referring to FIGS. 11 and 12, outer surfaces of the first and second subbanks 410_1 and 420_1 may be exposed to an etchant used in a process of forming the first and second subbanks 410_1 and 420_1 by using a first bank layer 400' (see FIG. 11) as an etch mask without an additional mask process. Therefore, the upper and side surfaces of the first and second subbanks 410_1 and 420_1 exposed to the etchant may be partially etched to form the predetermined surface roughness. Accordingly, the predetermined surface roughness may also be formed on upper surfaces of a first electrode 210 and a second electrode 220 conformally formed on the first and second subbanks 410_1 and 420_1. Light, emitted from light emitting elements ED and travelling to the first electrode 210 and the second electrode 220 may be diffusely reflected by the surface roughness formed on the surfaces of the first and second electrodes 210 and 220. This may reduce total reflection that may occur in insulating layers, thereby improving the light efficiency of the display device 10_2.

Figure 21:
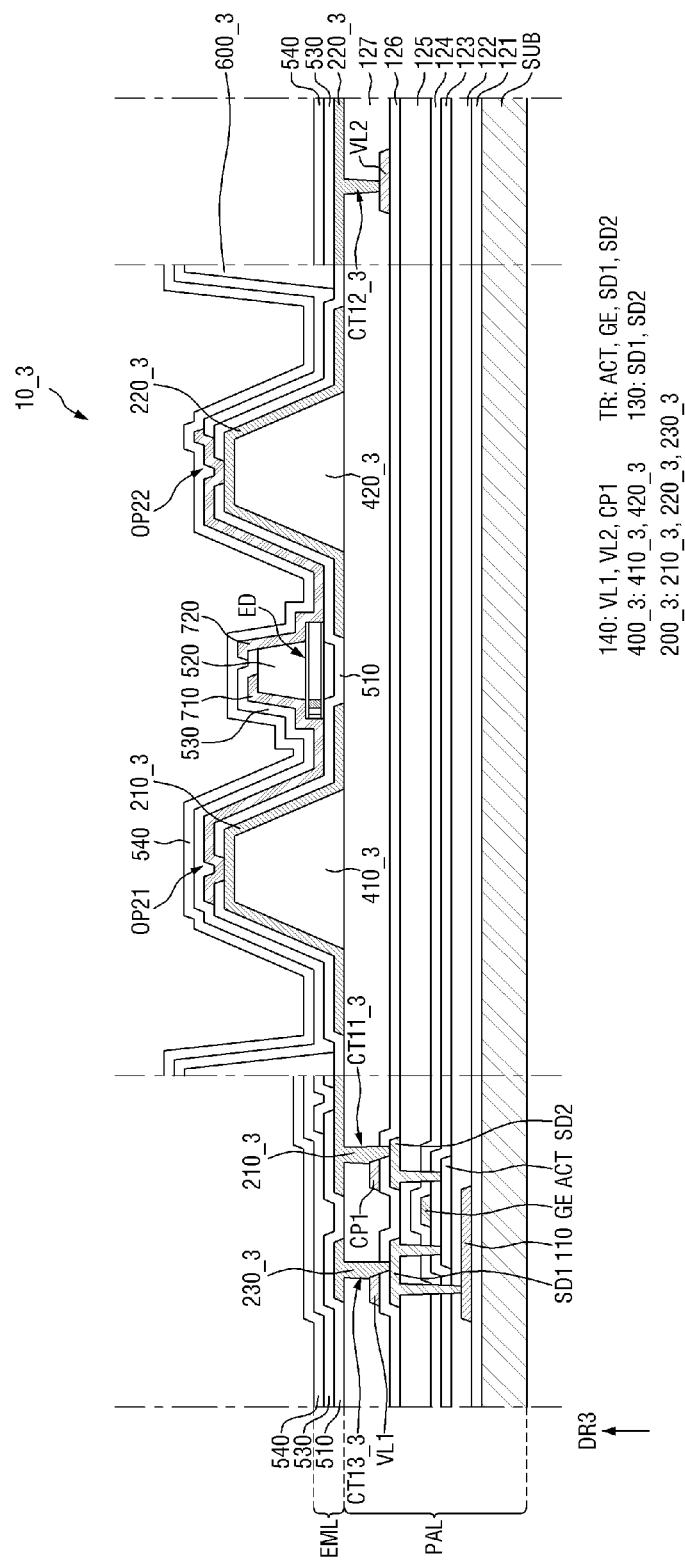
FIG. 21 is a schematic cross-sectional view of a display device according to an embodiment.

FIG. 21 is a schematic cross-sectional view of a display device 10_3 according to an embodiment.

Referring to FIG. 21, the display device 10_3 according to the embodiment may be different from the display device 10 of FIG. 3 at least in that a first bank 400_3 and a second bank 600_3 are spaced apart from each other, and first to third contact holes CT13_3, CT11 and CT12_3 do not overlap the first bank 400_3 in the third direction DR3.

Specifically, the first bank 400_3 may be disposed in an area defined by the second bank 600_3. Therefore, the first bank 400_3 and the second bank 600_3 may be spaced apart from each other. Each of a first subbank 410_3 and a second subbank 420_3 of the first bank 400_3 may be spaced apart from the second bank 600_3 in the area defined by the second bank 600_3.

First and second electrodes 210_3 and 220_3 may be disposed on the first and second subbanks 410_3 and 420_3 to overlap outer surfaces of the first and second subbanks 410_3 and 420_3, respectively.

The first electrode 210_3 may electrically connect a first conductive pattern CP1 and a second source/drain electrode SD2 of a transistor TR through a second contact hole CT11_3 penetrating a via layer 127 and a passivation layer 126. The second electrode 220_3 may be electrically connected to a second power line VL2 through the third contact hole CT12_3 penetrating the via layer 127. A connection pattern 230_3 may electrically connect a first power line VL1 and a first source/drain electrode SD1 of the transistor TR through the first contact hole CT13_3 penetrating the via layer 127 and the passivation layer 126. The first to third contact holes CT13_3, CT11_3, and CT12_3 may not overlap the first bank 400_3 in the third direction DR3.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first conductive layer disposed on a substrate;
a passivation layer disposed on the first conductive layer;
a second conductive layer disposed on the passivation layer;
a via layer disposed on the second conductive layer;
a third conductive layer disposed on the via layer, the third conductive layer including:
a first electrode;
a second electrode; and
a connection pattern, the first electrode, the second electrode, and the connection pattern being spaced apart from each other; and
a light emitting element, a first end and a second end of the light emitting element being disposed on the first electrode and the second electrode, respectively,
wherein the connection pattern electrically connects the first conductive layer and the second conductive layer through a first contact hole penetrating the via layer and the passivation layer.

2. The display device of claim 1, wherein the first contact hole exposes at least a part of an upper surface of the second conductive layer, at least a part of a side surface of the second conductive layer, and at least a part of an upper surface of the first conductive layer.

3. The display device of claim 1, wherein the connection pattern electrically contacts the part of the upper surface of the first conductive layer, the part of the upper surface of the second conductive layer, and the side surface of the second conductive layer.

4. The display device of claim 1, wherein
the first contact hole comprises a first part formed by sidewalls of the via layer, a second part formed by a side surface of the second conductive layer and a sidewall of the via layer, and a third part formed by sidewalls of the passivation layer, and
the first part, the second part, and the third part of the first contact hole overlap each other in a thickness direction of the substrate.

5. The display device of claim 4, wherein
a width of the first part is greater than a width of the second part, and
the width of the first part is greater than a width of the third part.

6. The display device of claim 4, wherein the first part, the second part, and the third part are integral with each other and form a hole.

7. The display device of claim 4, wherein the third part overlaps the first conductive layer in the thickness direction of the substrate and does not overlap the second conductive layer in the thickness direction of the substrate.

8. The display device of claim 4, wherein the third part is not disposed between the first conductive layer and the second conductive layer in the thickness direction of the substrate.

9. The display device of claim 1, further comprising a first insulating layer disposed on the third conductive layer, wherein
the first insulating layer completely overlaps the connection pattern, and
the light emitting element is disposed on the first insulating layer.

10. The display device of claim 9, further comprising:
a first contact electrode disposed on the first insulating layer and electrically contacting the first end of the light emitting element and the first electrode; and
a second contact electrode disposed on the first insulating layer and electrically contacting the second end of the light emitting element and the second electrode.

11. The display device of claim 1, further comprising a transistor disposed between the substrate and the second conductive layer, the transistor comprising:
an active layer;
a gate electrode;
a first source/drain electrode; and
a second source/drain electrode,
wherein the first source/drain electrode and the second source/drain electrode are included in the first conductive layer.

12. The display device of claim 11, wherein
the second conductive layer further comprises a first power line, and
the connection pattern electrically connects the first power line and the first source/drain electrode of the transistor through the first contact hole.

13. The display device of claim 12, wherein the first electrode is electrically connected to the second source/drain electrode of the transistor through a second contact hole penetrating the via layer and the passivation layer.

14. The display device of claim 12, wherein the connection pattern electrically contacts at least a part of an upper surface of the first source/drain electrode of the transistor, at least a part of an upper surface of the first power line, and a side surface of the first power line.

15. The display device of claim 1, wherein the passivation layer is disposed between the first conductive layer and the second conductive layer in the thickness direction of the substrate.

* * * * *